(12) United States Patent
Shau

(10) Patent No.: US 6,483,381 B1
(45) Date of Patent: *Nov. 19, 2002

(54) SIGNAL TRANSMISSION AND RECEIVING METHODS OPTIMIZED FOR INTEGRATED CIRCUIT IMPLEMENTATION

(76) Inventor: Jeng-Jye Shau, 991 Amarillo Ave., Palo Alto, CA (US) 94303

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/956,231

(22) Filed: Oct. 22, 1997

(51) Int. Cl.⁷ .............................................. H04L 27/06
(52) U.S. Cl. ...................... 329/317; 329/315; 329/316; 329/348; 329/327; 329/361; 329/362; 455/214; 375/324; 375/328; 375/320; 375/322
(58) Field of Search .................................. 375/285, 324, 375/328, 320, 322; 455/214; 329/317, 316, 315, 363, 348, 361, 362, 327

(56) References Cited

U.S. PATENT DOCUMENTS

| | | |
|---|---|---|
| 4,501,002 A | 2/1985 | Auchterlonie ............... 375/337 |
| 5,271,041 A | 12/1993 | Montreuil ..................... 375/97 |
| 5,410,280 A | 4/1995 | Linguet et al. ............. 332/149 |
| 5,477,199 A | 12/1995 | Montreuil .................... 332/103 |
| 5,507,024 A | 4/1996 | Richards, Jr. ............... 455/260 |

Primary Examiner—Arnold Kinkead

(57) ABSTRACT

This invention discloses a demodulation method. The method includes steps of: A) Receiving a modulated input signal having an input signal frequency. B) Generating a first switch control signal at a first switching frequency substantially equal to the input signal frequency. C) Generating a second switch control signal having the same frequency as the first switch control signal and having a phase that is approximately 90 degrees different from a phase of the first switch control signal. And D) Controlling at least two switching circuits with the first and second switch control signals for obtaining at least two sets of sampled amplitudes of the input signals for generating switching output signals for each of the switching circuits defined by subtracting the sampled amplitudes when the first switch control signal is high by the sampled amplitudes when the first switch control signal is low for each of the switching circuits to generate demodulated output signals for the modulated input signal.

16 Claims, 22 Drawing Sheets

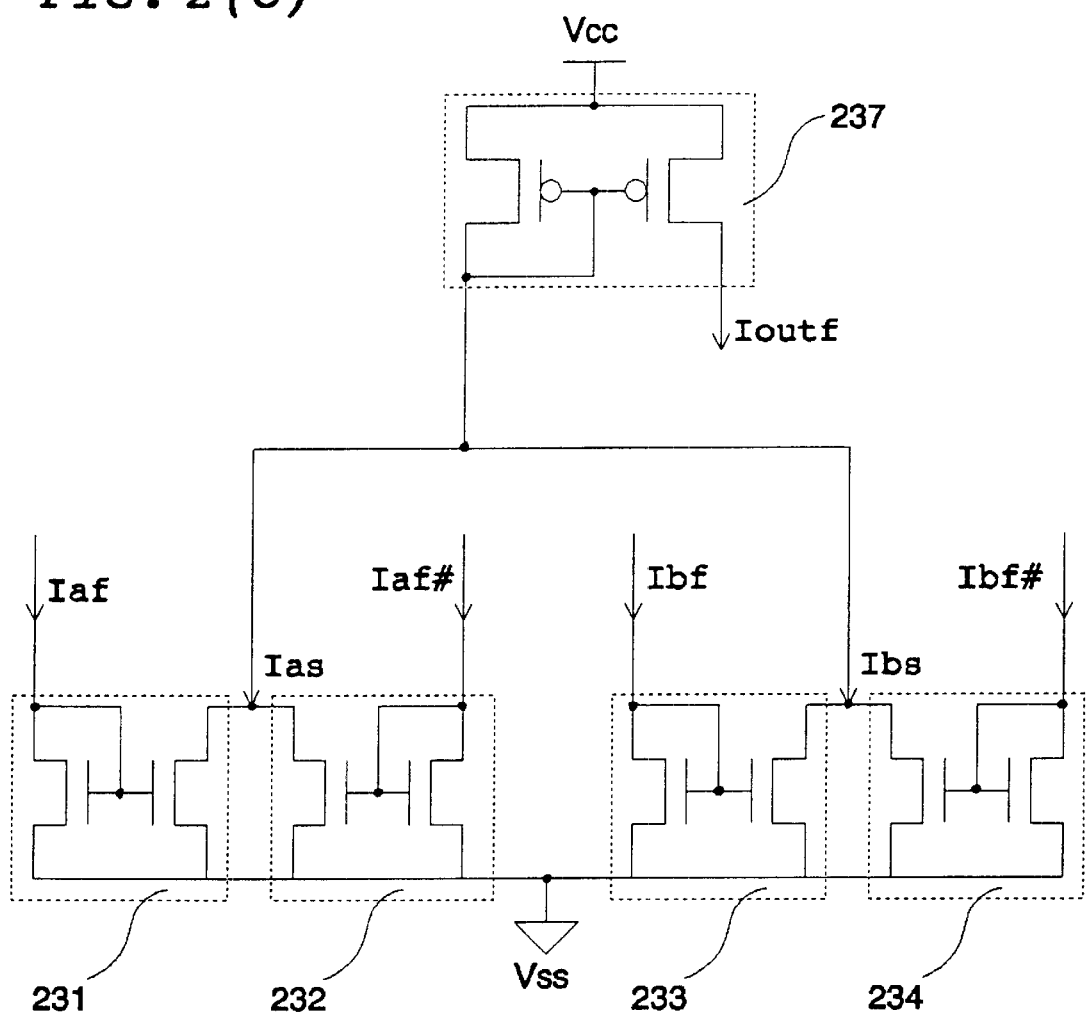

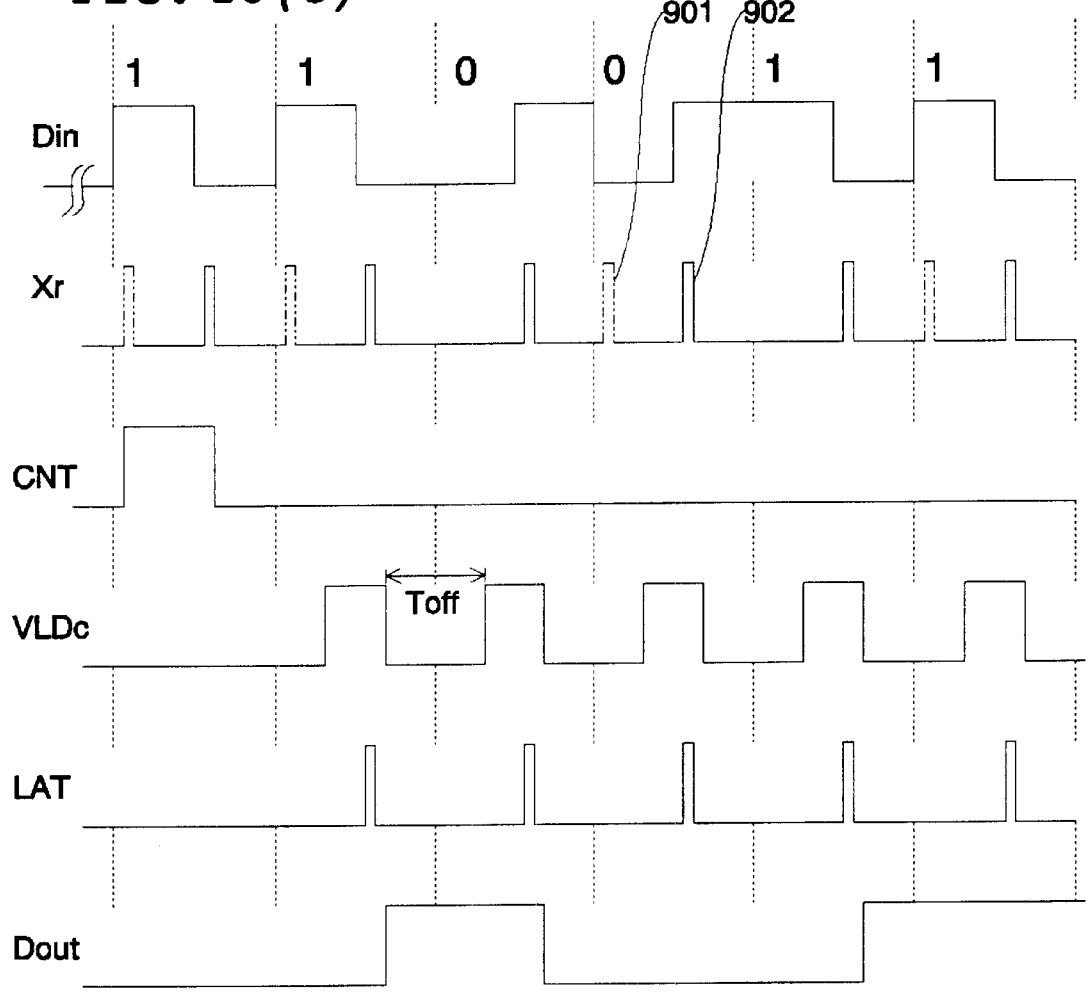

SIGNAL TRANSMISSION AND RECEIVING METHODS OPTIMIZED FOR INTEGRATED CIRCUIT IMPLEMENTATION

BACKGROUND OF THE INVENTION

The present invention relates to signal transmission and receiving methods, and more particularly to modulation, demodulation and decoding methods optimized for integrated circuit (IC) implementation Signal modulation is a common data transmission method. Low frequency information signals are transmitted through high frequency waves (called the carrier) by modulating different properties of the carrier such as amplitude modulation (AM), frequency modulation (FM), or pulse phase modulation (PPM). These modulation procedures result in narrow bandwidth waves (called the "channel") that can be transmitted with minimum interference from signals in other channels. To retrieve the data, a receiver generally has a mechanism to separate the carrier signals in the carrier channel, and another mechanism to extract the information signals from the carrier. Conventional demodulators usually use tuned amplifiers or band-pass filters to receive the carrier signal, and use low pass filters to extract the information. These filters often contain networks of capacitors, resistors, and inductors. For integrated circuit implementation, the design methodology is different from that of discrete circuits. IC technologies are optimized to build switching transistors; millions of transistors cart be manufactured in a small area with high yield and excellent uniformity. On the other hand, IC technologies are less effective in building passive components; resistors and inductors in IC occupy large area with relatively poor uniformity. It is therefore a common practice for IC designers to avoid using passive components whenever it is possible to use transistors. One well-known example is the "switching capacitor" (SC) technique that replaces resistors and inductors by switching transistors and capacitors. Filters built by the SC technique is proven to be highly successful for IC implementations, but SC technique is only applicable for low frequency operations. Another approach is to use a phase-locked loop (PLL) to synchronize internal clock signals with the carrier signals; demodulation mechanisms are then executed by switching circuits controlled by internal clock signals PLL is proven to be highly successful for many IC implementations. Its major problem is stability. As a sensitive analog feedback circuit, stability problems such as phase jitters and noise sensitivity are inevitable for PLL circuits. There are many other inventions developed to improve modulation or demodulation circuits for IC implementation. In U.S. Pat. No. 4,501,002 Auchterlonie described a demodulator for quadriphase shift keying (QPSK) signals. This invention is useful only for digital signals carried in QPSK format; it is not useful for signals in other formats, and it does not have the accuracy to decode analog signals, In U.S. Pat, No. 5,477,199 Montreuil described another system that is able to demodulate digital data in both vestigial side bad and offset keyed quadriphase signals. Again, the invention is useful only for specially formatted signals, and it is only for digital data decoding. Components used in Montreuil patent are also not optimized for IC implementation. It is highly desirable to be able to manufacture general purpose signal transmission and receiving circuitry optimized for IC technologies. It is also desirable to avoid using passive components or sensitive circuits such as PLL.

SUMMARY OF THE INVENTION

The primary objective of this invention is, therefore, to provide practical data transmission and receiving circuits optimized for integrated circuit implementation. The other primary objective of this invention is to improve reliability and stability of data transmission circuits. Another objective of the present invention is to provide practical methods to reduce transmission errors caused by non-ideal conditions. Another objective of the present invention is to provide the capability to transmit modulated signals that are not detectable with conventional demodulation methods. Another objective of the present invention is to maximize data transmission rate by demodulating both AM and FM signals simultaneously. It is a further objective of the present invention to provide a method to transmit and receive AM, FM, and digital data from the same carrier signal.

These and other objectives are accomplished by novel asynchronous demodulation methods. The demodulation methods extract information from carrier signals by switching transistors controlled by internal control signals Using multiple control signals with different phases, the demodulation methods of the present invention does not need to synchronize the internal control signals with the input carrier signals. It is therefore possible to avoid using sensitive analog circuits such as PLL or mixers. Demodulators of the present invention comprise mostly switching transistors; there are no passive resistors and inductors It is therefore ready to take full advantage of existing IC technologies to achieve highest performance using smallest area. Reliability and stability are improved by avoiding sensitive linear circuits or unstable feedback circuits. Circuit stability is further improved by a mechanism in the internal reference control signals that significantly improves circuit tolerance on non-ideal operation conditions. The demodulation methods of the present invention have a special property called "quadrant independence". When the phases of individual cycles of the carrier signal are shifted by an integral of 90 degrees, the demodulation results do not change. Utilizing this special property it is possible to transmit signals in a way that current art demodulators won't be able to detect It is also possible to improve data transmission rate by transmitting and receiving AM, FM, and digital signals simultaneously.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 2(c) is a schematic diagram for the output signal generator in FIG. 2(a);

FIG. 10(c) shows the waveforms of critical signals in FIGS. 10(a,b).

DETAILED DESCRIPTION OF THE INVENTION

Figure 1:
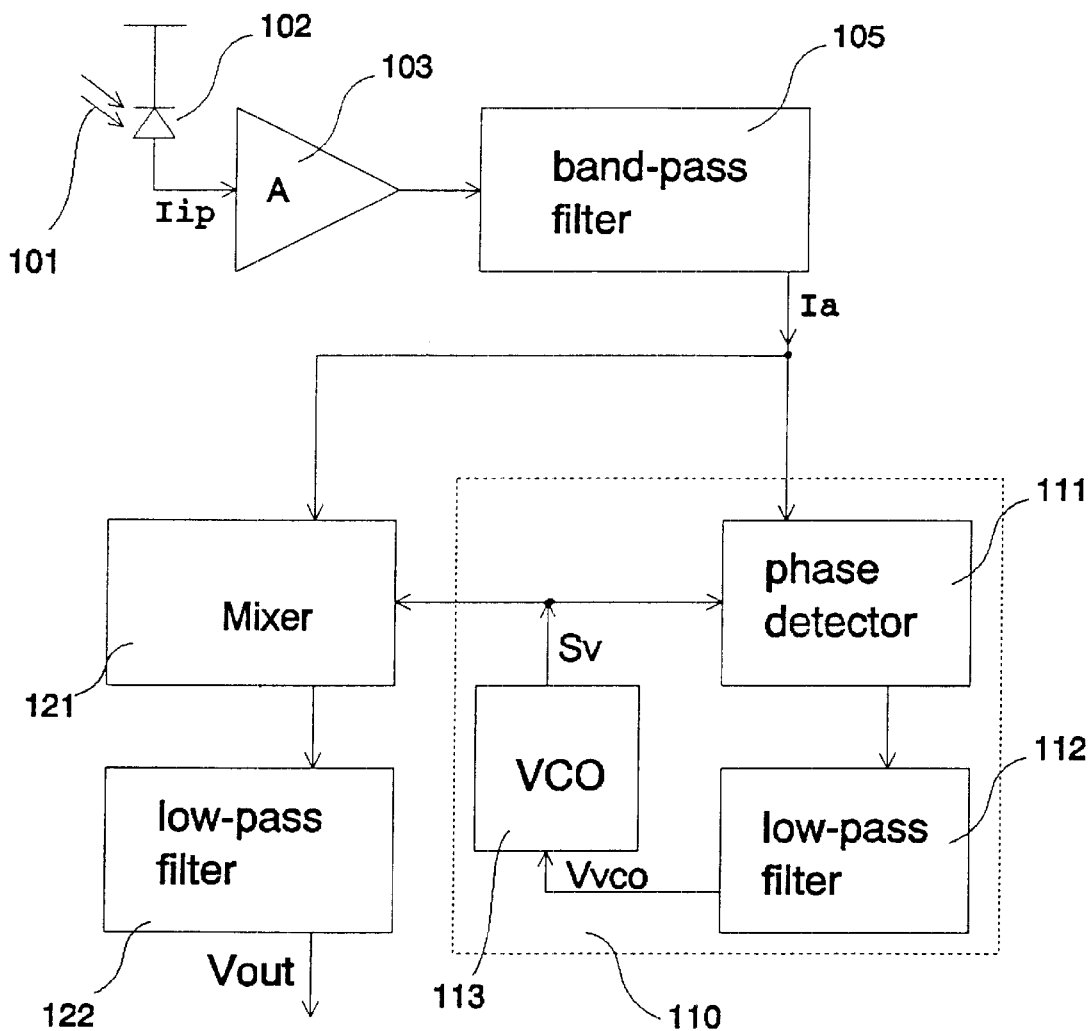
FIG. 1 is a block diagram of a prior art demodulator.

FIG. 1 shows an example of prior art demodulator used for infrared light wireless communication. Modulated infrared light signals (101) are detected by a photo diode (102). The output current (Iip) of the photo diode is magnified and filtered by a preamplifier (103) and a band-pass filter (105) to separate the carrier signal (Ia) from background noise. The carrier signal (Ia) is sent to a phase detector (111). The phase detector (111) calculates the phase difference between the carrier signal (Ia) and the output (Sv) of a voltage controlled oscillator (VCO). The output of the phase detector (111) is filtered by a low-pass filter (112) to generate the control voltage (Vvco) of the VCO (113). The phase detector (111), the low-pass filter (112), and the VCO (113) form a PLL (110) which forces the VCO output signal Sv to be in-phase with the carrier signals (Ia). The digital signal (Sv) generated by the PLL (110) is sent to a mixer (121) and a low-pass filter (122) to extract information signals (Vout). Operation principle of this prior art demodulator is well known to the art; there is no need to describe it in further details. Many components of this prior demodulator are not suitable for integrated circuit implementation. The high frequency band-pass filter (105) needs discrete passive components that are not suitable for IC implementation. The PLL is a sensitive linear feedback circuitry that requires careful calibration The maximum operational frequency of the demodulator is also limited by the stability of the PLL. The mixer is often manufactured as a separated discrete IC chip. The prior art system in FIG. 1 needs many discrete components, it is not optimized for IC implementation.

Figure 2A:
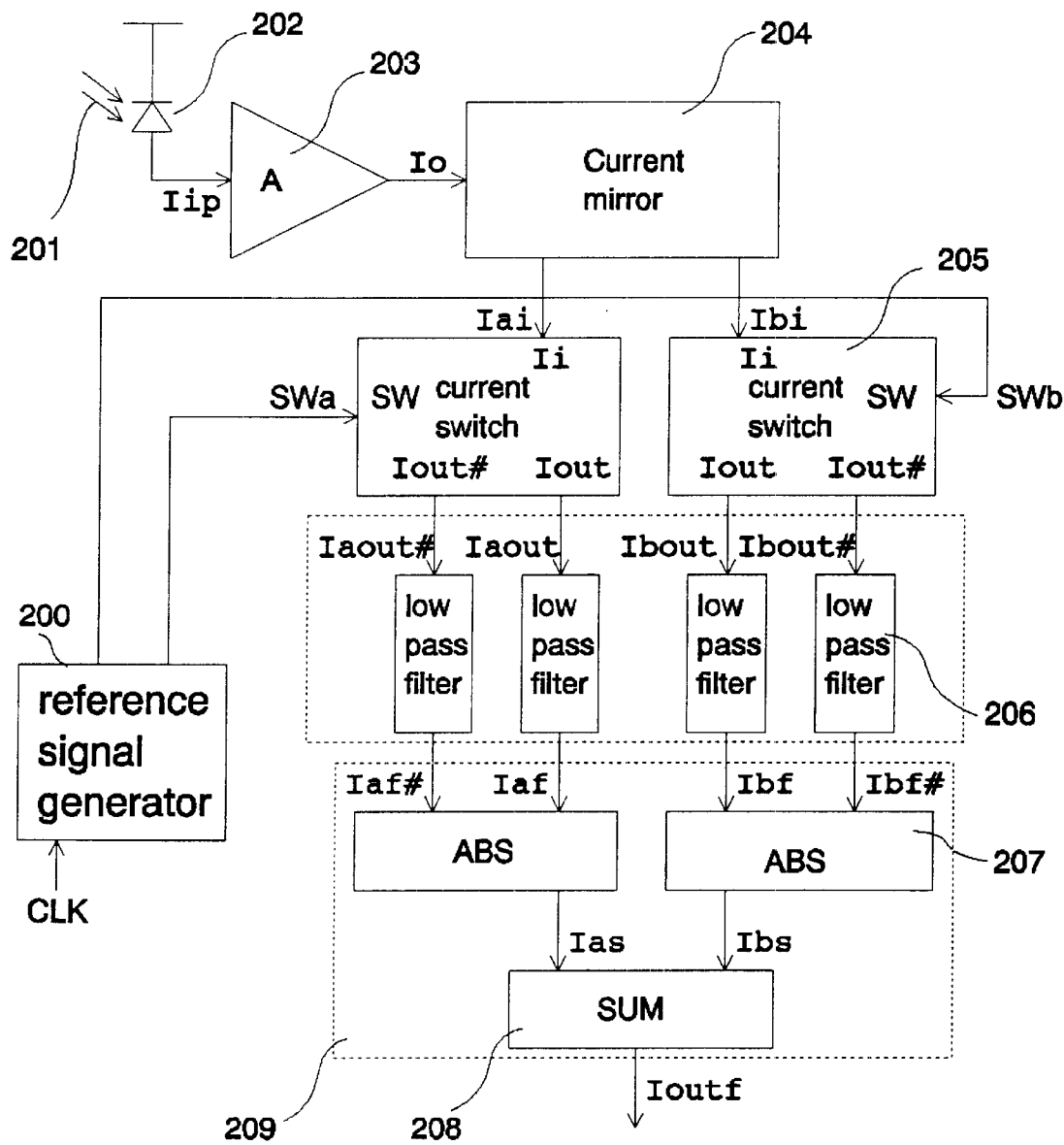
FIG. 2(a) is a block diagram for a demodulator of the present invention.
Figure 2B:
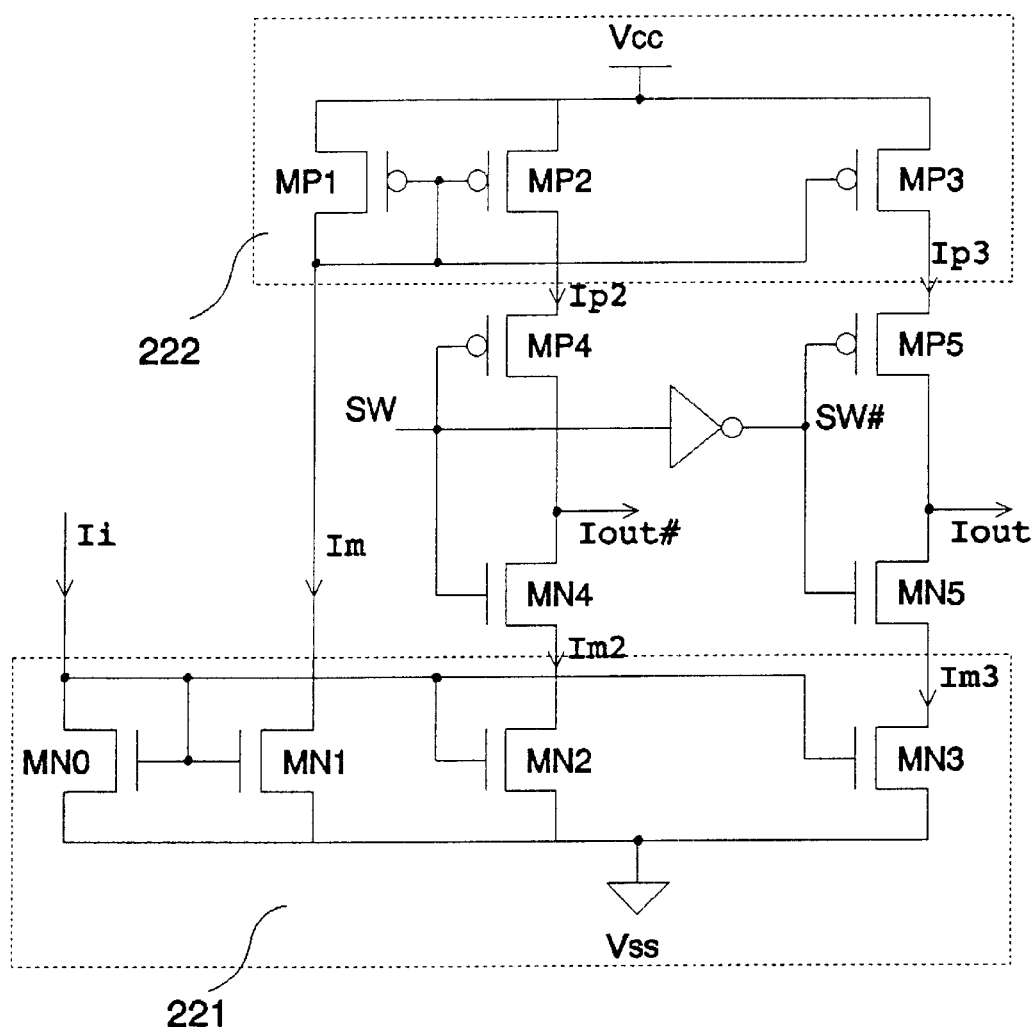
FIG. 2(b) is a schematic diagram for the current switch in FIG. 2(a)
Figure 2D:
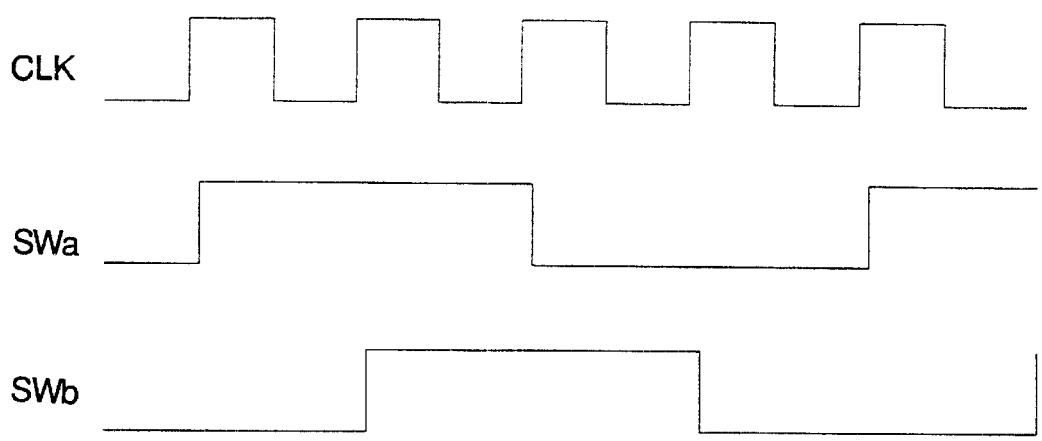
FIG. 2(d) shows the timing relationships of the reference control signals generated by the reference signal generator in FIG. 2(a)

FIG. 2(a) shows a demodulator of the present invention that serves the same functions as the prior art demodulator shown in FIG. 1. The input stages contain a light detector (202) and a preamplifier (203) identical to those in FIG. 1. The output current (Io) of the preamplifier 203 is duplicated by a current mirror (204). The output currents (Iai, Ibi) of the current mirror (204), are sent to two sets of current switches (205). Detailed designs of those current switches (205) are shown in FIG. 2(b) The input current (Ii) to the current switch (205) is duplicated by an n-channel current mirror (221) that comprises four transistors (MN0, MN1, MN2, MN3). One of the output currents (Im) of the n-channel current mirror (221) is connected to the input of a p-channel current mirror (222) that contains three transistors MP1, MP2, MP3). One output of the p-channel current mirror (Ip2) is connected to the source of a p-channel transistor (MP4) that is controlled by a reference control signal SW. The other output of the p-channel current mirror (Ip3) is connected to the drain of another p-channel transistor (MP5) that is controlled by a reference control signal (SW#). The second reference control signal (SW#) is the inverted signal of the first reference control signal (SW). The second output of the n-channel current mirror (Im2) is connected to the source of an nchannel transistor (MN4) that is controlled by the same reference control signal (SW) of transistor MP4. The third output of the n-channel current mirror (Im3) is connected to the source of an n-channel transistor (MN5) that is controlled by the same reference control signal (SW#) of transistor MN5. Sources of transistors MP4 and MN4 are connected as the first output node (Iout#) Sources of transistors MP5 and MN5 are connected as the second output node (Iout). When the reference control signal (SW) is high, the output current at the first output node (Iout#) has the same magnitude as the input current (Ii) but of opposite direction, while the output current at the second output node (Iout) equals the input current (Ii) in both amplitude and direction. When the reference control signal (SW) is low, the output current at the second output node (Iout) has the same magnitude as the input current (Ii) but of opposite direction, while the output current at the first output node (Iout#) equals the input current (Ii) in both amplitude and direction. Those two output currents (Iout, Iout#) always equals in amplitude but opposite in directions. Going back to FIG. 2(a), the outputs of those two current switches (Iaout, Iaout#, Ibout, Ibout#) are sent to low-pass filters (206) to generate filtered low frequency output signals (Iaf, Iaf#, Ibf, Ibf#). These low-pass filters (206) are manufactured using the switching capacitor technique for IC implementation. Those information signals are sent to an output signal generator (209) to generate output currents (Ioutf, Ias, Ibs). This output signal generator (209) comprises two absolute current generators (207) and one current adder (208). Details of the output signal generator (209) is shown in FIG. 2(c). The output current of the first current switch (Iaf) is sent to the input of an n-channel current mirror 231. The inverted output current of the first current switch (Iaf#) is sent to the input of another n-channel current mirror 232. The outputs of those two current mirrors (231, 232) are connected together to generate an absolute current (Ias). Since Iaf and Iaf# are always equal in amplitude but opposite in direction, the combined output current Ias always equals to the positive current of those two inputs (Iaf, Iaf#). On the other word, those two n-channel current mirrors (231, 232) form an absolute current generator. Similarly, the other two n-channel current mirrors (233, 234) form another absolute current generator. Its output current (Ibs) equals the absolute value of its inverted input current pairs (Ibf, Ibf#). The two outputs of those two absolute current generators (Ias, Ibs) are connected before they are sent to the input of a p-channel current mirror (237). The output (Ioutf) of the p-channel current mirror (237) is therefor equal to the summation of those two absolute currents (Ias, Ibs). Going back to FIG. 2(a), the reference control signals (SWa, SWb) for those two current switches (205) are provided by a reference signal generator (200). The frequency of the input clock signal (CLK) to the reference signal generator (200) is four times higher than the carrier signal frequency. This clock signal is used to generate two reference control signals (SWa, SWb) of the same frequency as the carrier signal. The timing relationship between the clock signal (CLK) and those two reference control signals (SWa, SWb) are illustrated in FIG. 2(d). Both reference control signals have 50% duty cycles, and their frequencies are identical to the carrier frequency; the phase difference between them is 90 degrees.

Figure 3:
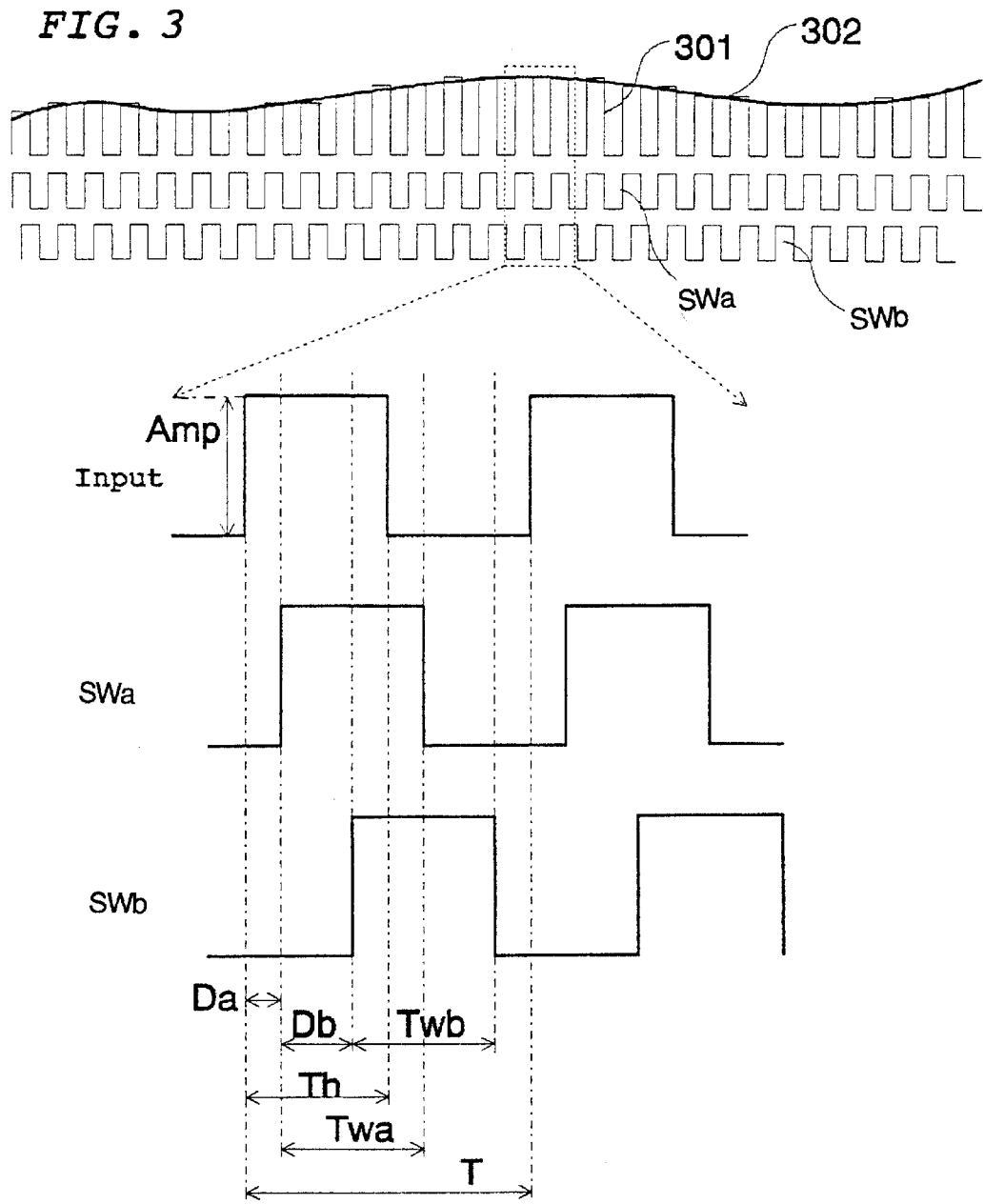
FIG. 3 illustrates the timing relationship between modulated input signals and reference control signals.

FIG. 3 shows the timing relationships between the reference control signals (SWa, SWb) and the input signals. For simplicity, we assume that the input carrier signals 301 are square waves with their amplitudes modulated by low frequency information signals 302. Two cycles of those signals are magnified to reveal more details as shown in FIG. 3. All of those signals have the same period (T). We define Th as the time when the input carrier signal is high in each period, Twa as that of the first reference control signal (SWa), and Twb as that of the second reference control signal (SWb). The rising edge of SWa is lagged by Da after the rising edge of the carrier signal (301). The rising edge of SWb is lagged by Db after the rising edge of the SWa. Based on the above definitions, the filtered output signals (Iaf, Ibf) and the final output signal (Ioutf) can be written as $$Iaf = \left[\int_{Da}^{Da+Twa} Amp\, dt - \int_{Da+Twa}^{Da+T} Amp\, dt\right]/T \quad (1)$$

$$Ibf = \left[\int_{Da+Db}^{Da+Db+Twa} Amp\, dt - \int_{Da+Db+Twa}^{Da+Db+T} Amp\, dt\right]/T \quad (2)$$

$$Ioutf = ABS(Iaf) + ABS(Ibf) \quad (3)$$

where Amp is the amplitude of the carrier signal. Those integrals are limited in one period of the carrier signal based on the assumption that the low pass filter will filter out high frequency components in Amp; we also can treat Amp as a constant within one period based on the same assumption.

Case study: ideal condition.

At ideal condition, the input carrier and the switching signals are all ideal square waves with 50% duty cycles; we have Twa=Twb=Th=T/2 and Db=T/4. From Eqs. (1–3), we have $$Iaf = (1/2 - 2Da/T) * Amp \quad \text{when } Da < T/2 \quad (4)$$
$$= (2Da/T - 3/2) * Amp \quad \text{when } Da > T/2$$

$$Ibf = -2Da/T * Amp \quad \text{when } Da < T/4 \quad (5)$$
$$= (2Da/T - 1) * Amp \quad \text{when } T/4 < Da < 3T/4$$
$$= (2 - 2Da/T) * Amp \quad \text{when } 3T/4 < Da < T$$

$$Ioutf = ABS(Iaf) + ABS(Ibf) = Ias + Ibs = Amp/2 \quad (6)$$

$$Iaf/Ioutf = (1 - 4Da/T) * Amp \text{ when } Da < T/2$$
$$= [4(Da/T - 1/2) - 1]Amp \text{ when } Da > T/2 \quad (7)$$

$$Ibf/Ioutf = 4Da/T * Amp \text{ when } Da < T/4$$
$$= [4(Da/T - 1/4) - 1] * Amp \text{ when } T/4 < Da < 3T/4$$
$$= [1 - 4(Da/T - 3/4)] * Amp \text{ when } 3T/4 < Da < T \quad (8)$$

where Ias=ABS(Iaf) is the absolute value of Iaf, and Ibs=ABS(Ibf) is the absolute value of Ibf. These relationships are further illustrated in FIG. 4(a). There are many useful results described in Eqs. (4–8).

Eq. (6) shows that the summing output current (Ioutf) of the demodulator in FIG. (2a) is proportional to the amplitude (Amp) of the information signal, and it is completely independent on the phase difference (Da) between the carrier signals (301) and internal reference control signals (SWa, SWb). On the other word, we do not need to use a PLL to synchronize internal control signals with the carrier signals; the phase difference between them does not influence results if we use a demodulator of the present invention to extract AM signals. When Da is a constant, any one of the signals Iaf, Iaf#, Ibf, Ibf#, Ias, and Ibs can be used to determine AM signals.

Figure 4A:
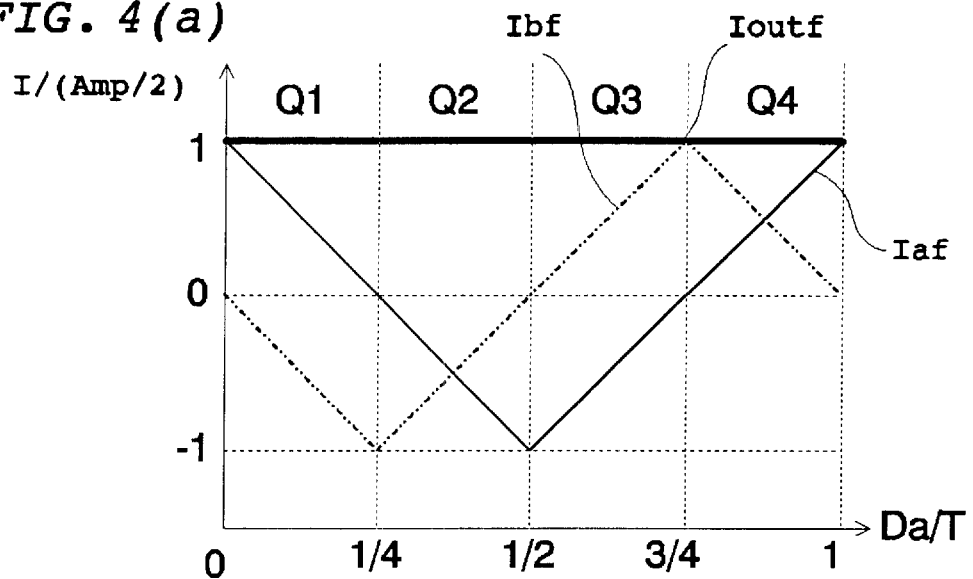
FIG. 4(a) shows the phase dependency for the output currents of an ideal demodulator of the present invention.
Figure 4B:
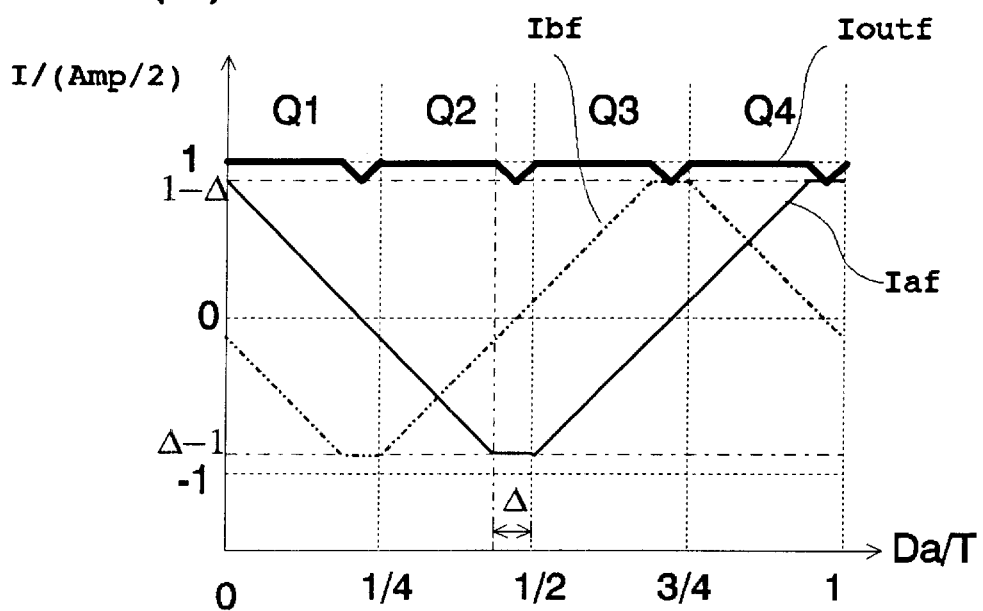
FIGS. 4(b,c) show the effects of non-ideal carrier duty cycle on the output currents for a demodulator of the present invention.
FIG. 4(d) shows the effects of non-ideal phase difference between reference control signals on the output currents for a demodulator of the present invention.
FIG. 4(e) shows the effects of non-ideal duty cycle on the output currents for a demodulator of the present invention.
FIG. 4(f) illustrates conditions when a demodulator of the present invention is not sensitive to non-ideal input signals or control signals.
Figure 4C:
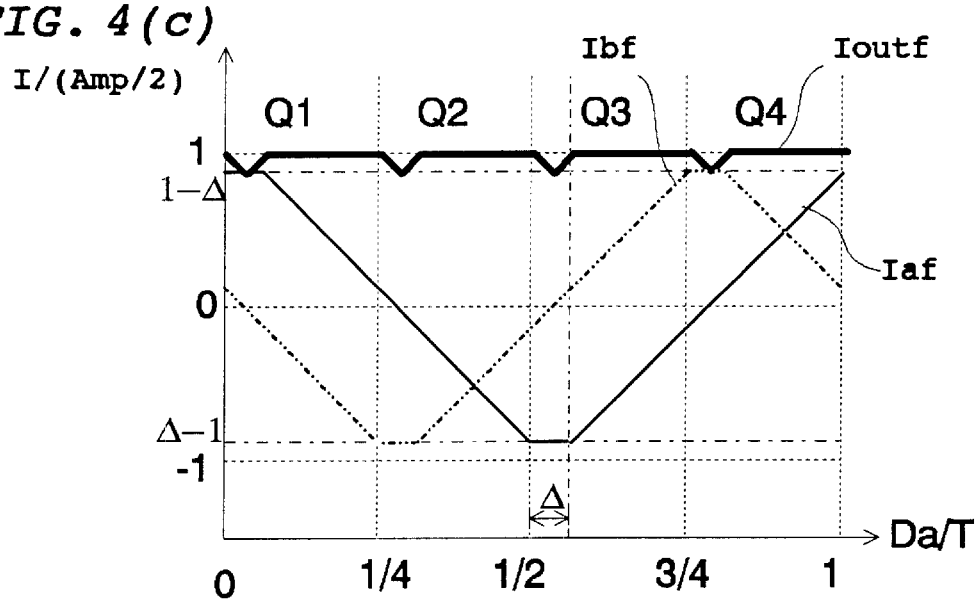

Eqs. (4,5) show that there is a linear relationship between the filtered output currents (Iaf, Ibf) and Da within each quadrant (Q1, Q2, Q3, Q4) of a period, as illustrated in FIG. 4(a). On the other words, FM signals can be determined from Iaf and Ibf, as long as the FM signal does not move the operation condition cross one of the quadrant boundaries. As a matter of fact, iaf, ia#, Ibf, Ibf#, Ias, and Ibs all can be used to extract FM signals under the same constraint. Again, there is no need to use a PLL.

Eqs. (7,8) show that the ratios of filtered outputs (Iaf/Ioutf, Ibf/Ioutf) are independent on the amplitude (Amp) of the input signal while they have linear relationship with Da within each quadrant (Q1–Q4) of a period. It is therefore possible to determine both AM and FM signals simultaneously; AM signals are determined by Ioutf; FM signals are determined from any one of the normalized output signals (Iaf/Ioutf, Iaf#/Ioutf, Ibf/Ioutf, Ibf#/Ioutf, Ias/Ioutf, Ibs/Ioutf). There is no need to use a PLL.

In the above discussions, we assumed that both input signals and switching signals are ideal square waves with 50% duty cycles. In a practical environment, the input signals are not likely to be ideal after they are transmitted through complex, noisy environments. The switching signals (SWa, SWb) can be very close to ideal because they are generated internally from the same clock signal. However, we still need to make sure that the outputs of our circuits are stable when those switching signals are not ideal. Non-ideal conditions are discussed in the following sections. Practical methods to avoid undesired effects caused by non-ideal conditions are described thereafter.

Case study: effects of non-ideal input signals

Assume that we still have ideal switching signals so that Twa=Twb=T/2, and Db=T/4, but the carry duty cycle is less than 50% so that Th=(1−Δ)T/2. Using Eqs. (1–3), we have $$Iaf = [(1-\Delta)T/2 - 2Da] * Amp \quad \text{when } Da < (1-\Delta)T/2 \qquad (9)$$
$$= -(1-\Delta)T/2 * Amp \quad \text{when } (1-\Delta)T/2 < Da < T/2$$
$$= [2Da - (2-\Delta)T/2] * Amp \quad \text{when } T/2 < Da < T/2 + (1-\Delta)T/2$$
$$= (1-\Delta)T/2 * Amp \quad \text{when } T/2 + (1-\Delta)T/2 < Da < T$$

$$Ibf = [(1-\Delta)T/2 - 2Da - T/2] * Amp \quad \text{when } Da < (1-\Delta)T/2 - T/4 \qquad (10)$$
$$= -(1-\Delta)T/2 * Amp \quad \text{when } (1-\Delta)T/2 - T/4 < Da < T/4$$
$$= [2Da - (2-\Delta)T/2] * Amp \quad \text{when } T/4 < Da < T/4 + (1-\Delta)T/2$$
$$= (1-\Delta)T/2 * Amp \quad \text{when } T/4 + (1-\Delta)T/2 < Da < 3T/4$$
$$= [(4-\Delta)T/2 - 2Da] * Amp \quad \text{when } 3T/4 < Da < T$$

$$Ioutf = [(1-\Delta)T - 2Da] * Amp \quad \text{when } (1-\Delta)T/2 - T/4 < Da < (1-\Delta)T/4 \qquad (11)$$
$$= 2Da * Amp \quad \text{when } (1-\Delta)T/4 < Da < T/4$$
$$= [T/2 + (1-\Delta)T - 2Da] * Amp \quad \text{when } (1-\Delta)T/2 < Da < (2-\Delta)T/4$$
$$= (2Da - T/2) * Amp \quad \text{when } (2-\Delta)T/4 < Da < T/2$$
$$= [(2-\Delta)T - 2Da] * Amp \quad \text{when } (3/2-\Delta)T/2 < Da < (3-\Delta)T/4$$
$$= (2Da - T) * Amp \quad \text{when } (3-\Delta)T/4 < Da < 3T/4$$
$$= [(5/2-\Delta)T - 2Da] * Amp \quad \text{when } (2-\Delta)T/2 < Da < (4-\Delta)T/4$$
$$= (2Da - 3T/2) * Amp \quad \text{when } (4-\Delta)T/4 < Da < T$$
$$= T/2 * Amp \quad \text{otherwise.}$$

Results in Eqs. (9–11) are plotted in FIG. 4(b). In similar ways, we can determine the output currents Ioutf, Iaf, Ibf, for the case when the carrier duty cycle is larger than 50%, that is, when Th=(1+Δ)T/2. The results are plotted in FIG. 4(c). FIGS. 4(b,c) reveal many interesting results. The output Ioutf remains identical to the ideal value (Amp/2) except at the regions within ΔT/2 to the boundaries of each quadrant. The linear relatonships between filtered output currents (Iaf, Ibf) and Da remain the same except the regions within ΔT/2 to the boundaries of each quadrant. For all the outputs (Iab, Ibf, Ioutf), the maximum error caused by the above non-ideal effect is Δ times their ideal values.

The above observations show that non-ideal carrier duty cycle has no effect to the demodulation methods of the present invention if we can operate away from the quadrant boundaries. The width of the regions we need to avoid is directly proportional to the magnitude of the non-ideal effect (Δ).

Case study: effects of non-ideal reference control signals

The effects of non-ideal reference control signals also can be calculated from Eqs. (1–3). For simplicity, the results are plotted graphically in FIGS. 4(d,e).

Figure 4D:
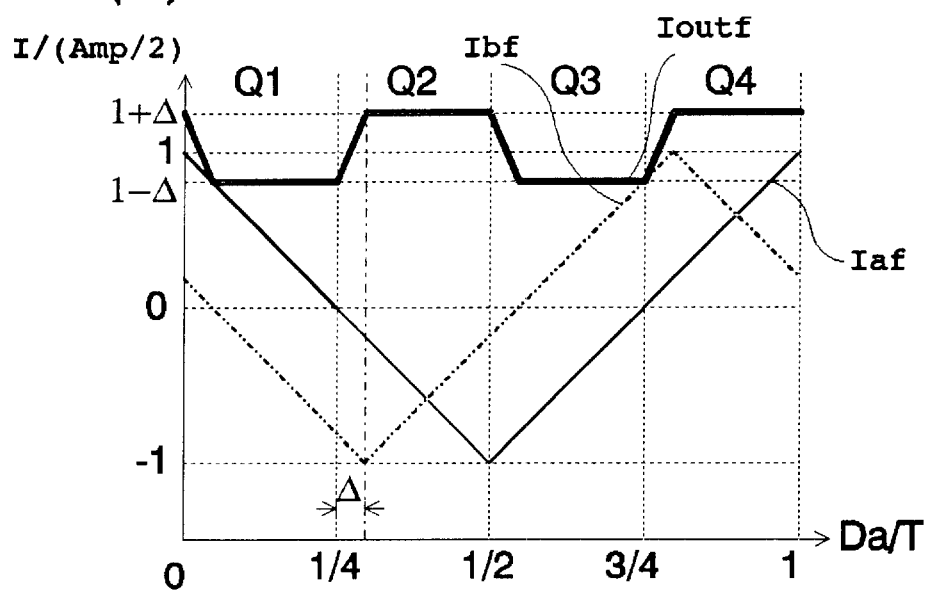

FIG. 4(d) illustrate s the non-ideal effect when the phase difference between SWa and SWb is not 90 degree. The conditions plotted in FIG. 4(d) are Twa=Twb=Th=T/2, and Db=(1–Δ)T/4, The results show that Ioutf remains as a constant in each quadrant (Q1–Q4) except at regions near the quadrant boundaries. The amplitude of Ioutf is reduced to (1–Δ) times of its ideal value in quadrants Q1 and Q3. The amplitude of Ioutf is increased to (1+Δ) times of its ideal value in quadrants Q2 and Q4. Ibf still has a linear relationship with Da, except its phase is shifted by Δ.

Figure 4E:
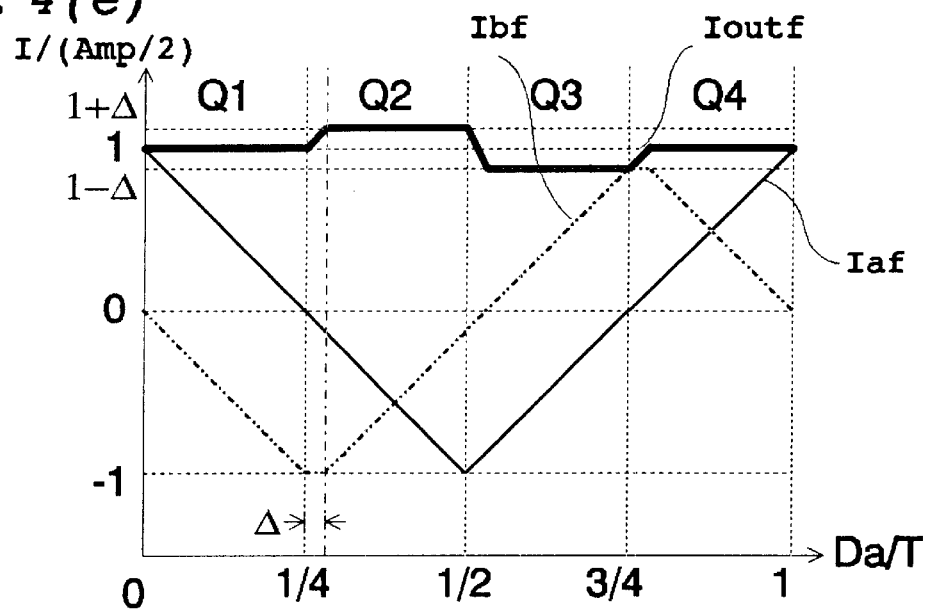
Figure 4F:
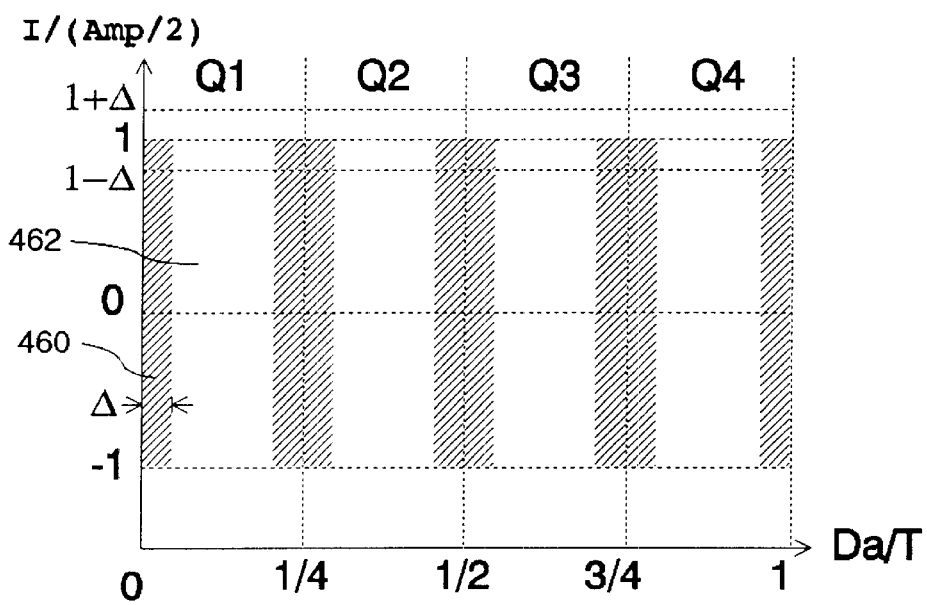

FIG. 4(e) illustrates the non-ideal effects when the duty cycle of one of the switching signal (SWb) is less than 50%. The conditions plotted in FIG. 4(e) are Twa=Th=T/2, Db T/4 and Twb=(131Δ)T/2. The results show that Ioutf remains as a constant in each quadrant (Q1–Q4) except at regions near the quadrant boundaries. The amplitude of Ioutf is reduced to (1–Δ) times of its ideal value in quadrant Q3. It is increased to (1+Δ) times of its ideal value in quadrant Q2, and it remains at its ideal value in quadrants Q1 and Q4 fbf still has a linear relationship with Da, except at quadrant boundaries.

The non-ideal effects of other parameters, including the conditions when multiple parameters are not ideal, also can be calculated and plotted in similar ways. We will not repeat more descriptions on the effects of other parameters because all of such studies lead to the same conclusions as:

Conclusion 1: For most conditions, the output Ioutf does not depend on Da except at the regions within Δ*T/2 to the boundaries of each quadrant, where Δ is a ratio representing the combined non-ideal effects from all sources.

Conclusion 2; The linear relationships between filtered output currents (Iaf, Ibf ) and Da remain the same except at the regions within Δ*T/2 to the boundaries of each quadrant.

Conclusion 3: For all the outputs (Iaf, Ibf, Ioutf), the maximum error caused by the above non-ideal effect is Δ times their ideal values.

The above discussions show that the effect of non-ideal input or control signals are negligible if Δ is small. Even when Δ is significant, we still can avoid it by operating at regions away from error sensitive regions that are represented by the shaded regions (460) in FIG. 4(f). As soon as we stay in the "safe zones" around the center regions (462) in one of the quadrants Q1–Q4, the outputs of the represent invention are the sane as ideal results in Eqs. (4–8). It is noteworthy to point out one difference between conventional PLL demodulators and demodulators of the present invention. PLL circuits require internal clock to be in phase with carrier signals. On the other word, PLL only operates at one "safe point" when the phase difference is zero. Demodulators of the present invention can operate at wide ranges of safe zones. It is therefore obvious that the present invention is by far more stable.

View FIGS. 4(a–f) carefully, we have another important conclusion as:

Conclusion 4: The absolute values of Ioutf and the absolute values of the slopes of the filtered output currents (Iaf, Iaf#, Ibf, Ibf#, Ias, Ibs) remain roughly the same when Da is shifted by an integer multiple of 4/T.

Figure 5A:
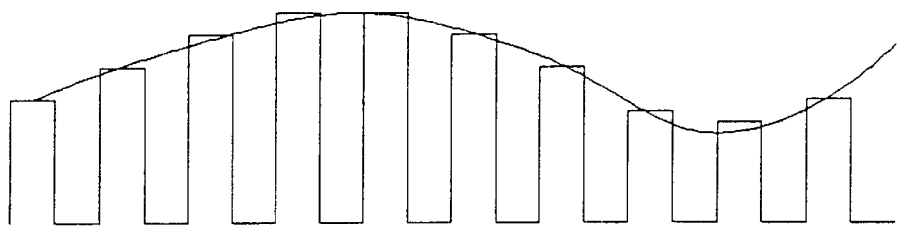
FIGS. 5(a–c) illustrates the timing relationships of modulated signals of the present invention.
Figure 5B:
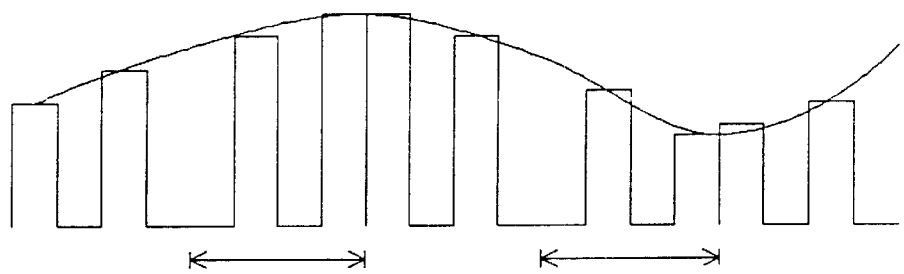
Figure 5C:
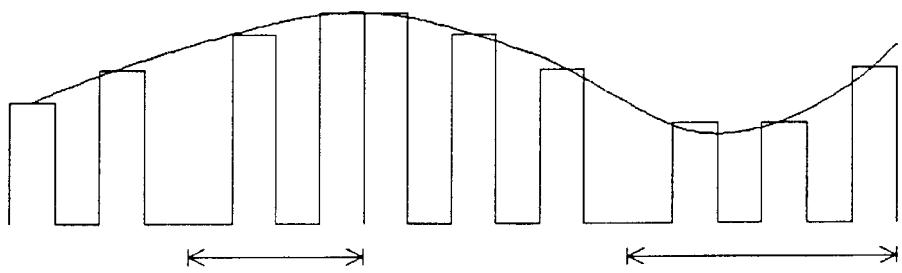

Conclusion 4 is not absolutely true because none-ideal effects cause by internal reference control signals (SWa, SWb) can cause small differences. However, it is a practical approximation because the non-ideal effects of SWa and SWb are typically very small in practical integrated circuits of the present invention. We will call this special property of the present invention the "quadrant independence" property This quadrant independence property of the present invention leads to novel modulation methods as illustrated in FIGS. 5(a–c). FIG. 5(a) shows an example of a typical pulsed AM signal. FIG. 5(b) shows an example of modulated carrier signals of the present invention that contain the same AM information signal. The differences between the signals in FIG. 5(a) and the signals in FIG. 5(b) are that the phases of the carrier pulses in FIG. 5(b) are shifted by 180 degrees for every two pulses. Prior art demodulators will not be able to extract the information carried by the signals in FIG. 5(b), while demodulators of the present invention will obtain the same results when those pulses are shifted by integer multiples of 90 degrees. Another example of this type of encoding method is shown in FIG. 5(c); 180 degree phase shifts are done for every two pulses then for every three pulses. There are infinite numbers of ways for such encoding methods of the present invention. The phase shift can be any integer multiples of 90 degrees at any combinations. Both AM and FM information can be carried by this encoding method. The resulting signals will not be detectable with conventional demodulators. The information can be extracted only by systems equipped with demodulators of the present invention. This is therefore an excellent method to protect the information in the transmitted data. If the transmission channel has enough bandwidth, the carrier signal of the present invention can carry three types of information simultaneously: (1)AM signal represented by variations of the amplitudes of carrier pulses, (2)FM signal represented by small variations of the phase of the carrier pulses, and (3)carrier codes represented by 0, 90, 180, or 275 degree phase shifts of carrier pulses. The carrier codes can be used for security purpose or for digital data transfer. The FM signals also can carry digital data. The difference between the FM signal and the carrier code is in the magnitudes of phase shifts. The FM signal use small phase shifts of the pulses to transfer low frequency data while the security codes use 90, 190, or 275 degree phase shifts to represent digital data at carrier frequency.

For simplicity, we assumed that the input carrier signals are square waves in the above discussions. In fact, the present invention is applicable to input signals of any shapes We will discuss another common condition when the input carrier is sine wave. Based on the examples for square wave and sine wave, applications of the present invention to other shapes of input waves should be obvious to those skilled in the art.

Using the same definitions of the parameters in FIG. 3 and assuming the carrier is a sine wave, the filtered output signals (Iaf, Ibf) and the final output signal (Ioutf) can be written as $$Iaf = Amp/T * \{\int_{Da}^{Da+Twa} SIN(2\pi t/T)dt - \int_{Da+Twa}^{Da+T} SIN(2\pi t/T)dt\} \quad (12)$$

$$Ibf = Amp/T * \{\int_{Da+Db}^{Da+Db+Twa} SIN(2\pi t/T)dt - \int_{Da+Db+Twa}^{Da+Db+T} SIN(2\pi t/T)dt\} \quad (13)$$

where we assume that Amp can be treated as a constant within a few periods of the carrier. At ideal conditions we have Twa=Twb=Th=T/2 and Db=T/4. From Eqs. (12, 13), we have $$Iaf = 2T/\pi * Amp * COS(2\pi Da/T) \quad (14)$$

$$Ibf = -2T/\pi * Amp * SIN(2\pi Da/T) \quad (15)$$

$$Amp = \pi/2T \, (Iaf^2 + Ibf^2)^{1/2} \quad (16)$$

$$Ibf/Iaf = -TAN(2\pi Da/T) \quad (17)$$

Figure 6:
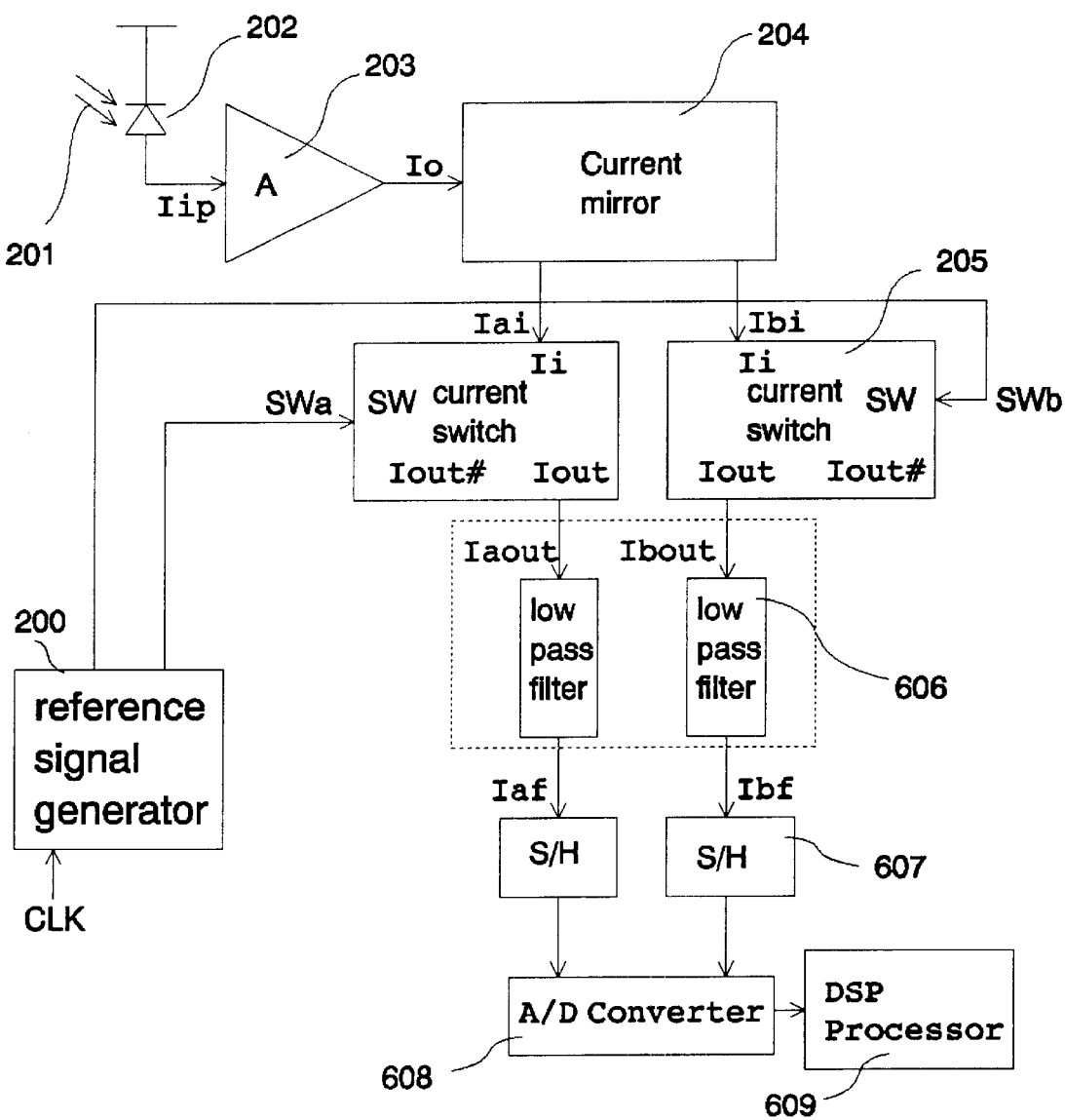
FIG. 6 is a block diagram for a demodulator of the present invention using digital signal processing methods for data analysis.

Eq. (16) shows that the AM signals is proportional to $(Iaf^2 + Ibf^2)^{1/2}$, and the result does not depend on the phase difference Da. The FM signal can be determined by Iaf, Ibf, or Ibf/Iaf as shown in Eqs. (14, 15, 17). Simultaneous demodulation of both AM and PM signals can be done based on Eqs. (16, 17). Although analog circuits for calculating $(Iaf^2 + Ibf^2)^{1/2}$ are known in current art IC design, we prefer using digital signal processing (DSP) methods as illustrated in FIG. 6. The outputs of low pass filters (606) are captured by sample-and-hold (S/H) circuits. The outputs of those S/H circuits are digitized by analogy-to-digital (A/D) converters, and the resulting digital data are analyzed by a DSP processor (609). Such DSP circuits are well known to the art; they provide flexibility to adapt for different cases. For cost-sensitive applications, we can avoid using DSP methods by using any one of the output signals (Iaf, Iaf#, Ibf, Ibf#, Ias, Ibs) to extract the information signals. Those signals are proportional to Amp as soon as the phase difference Da can be treated as a constant.

The non-ideal effects for the cases when the carrier signals are not square waves also can be analyzed in similar ways as shown in FIGS. 4(b–f). Those who are familiar with the art should be able to reach the conclusion that we can obtain near-ideal results if we can operate away from those error-sensitive quadrant boundaries. Theoretically, results obtained by demodulators of the present invention are independent of the phase difference between internal clock and the carrier signal. Practically, we should avoid non-ideal effects by operating away from the quadrant boundaries. A demodulator designed to avoid those non-ideal effects are shown in FIGS. 7(a–e).

Figure 7A:
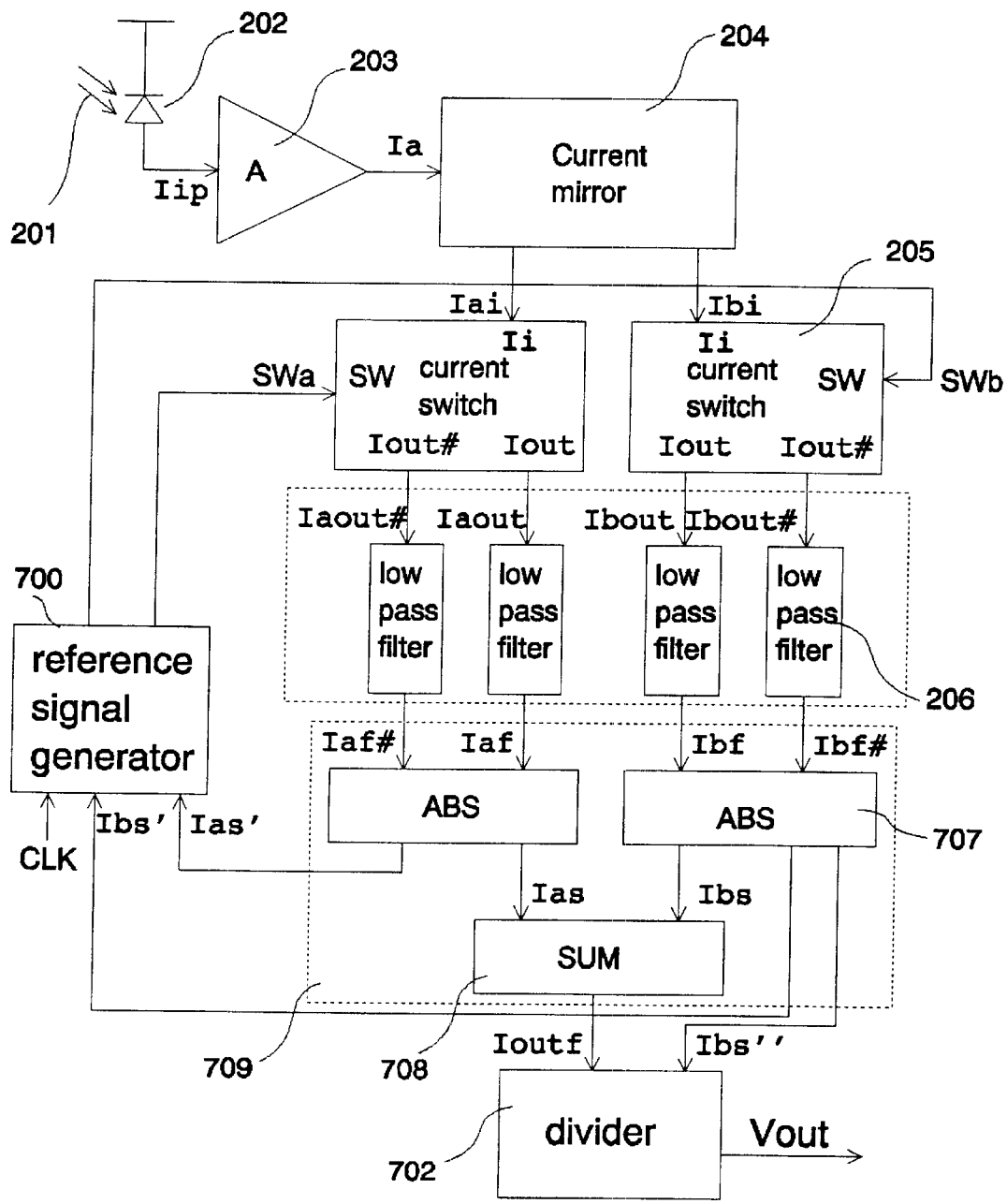
FIG. 7(a) shows the block diagram of a demodulating system of the present invention that is able to avoid non-ideal effects.
Figure 7B:
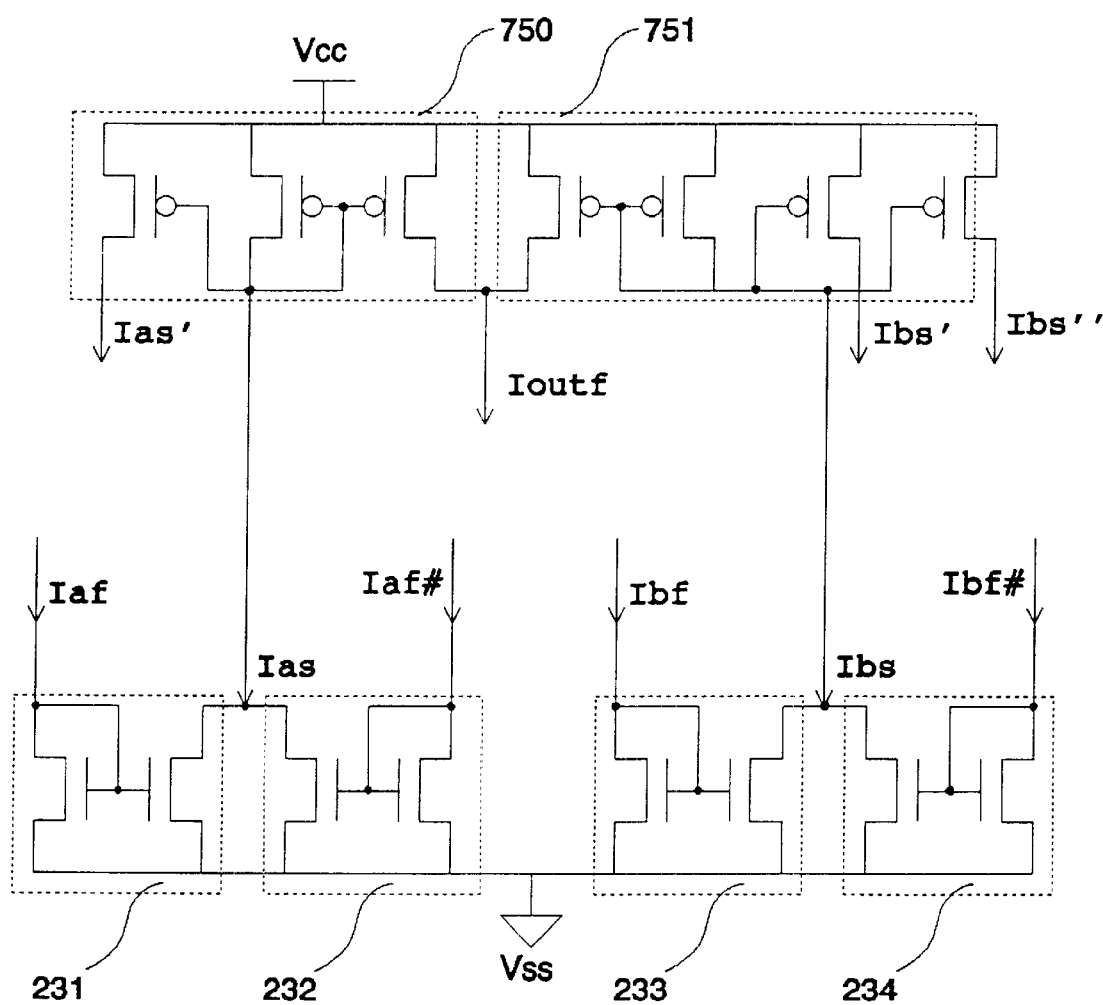
FIG. 7(b) is the schematic diagram for the output signal generator of the system in FIG. 7(a)
Figure 7C:
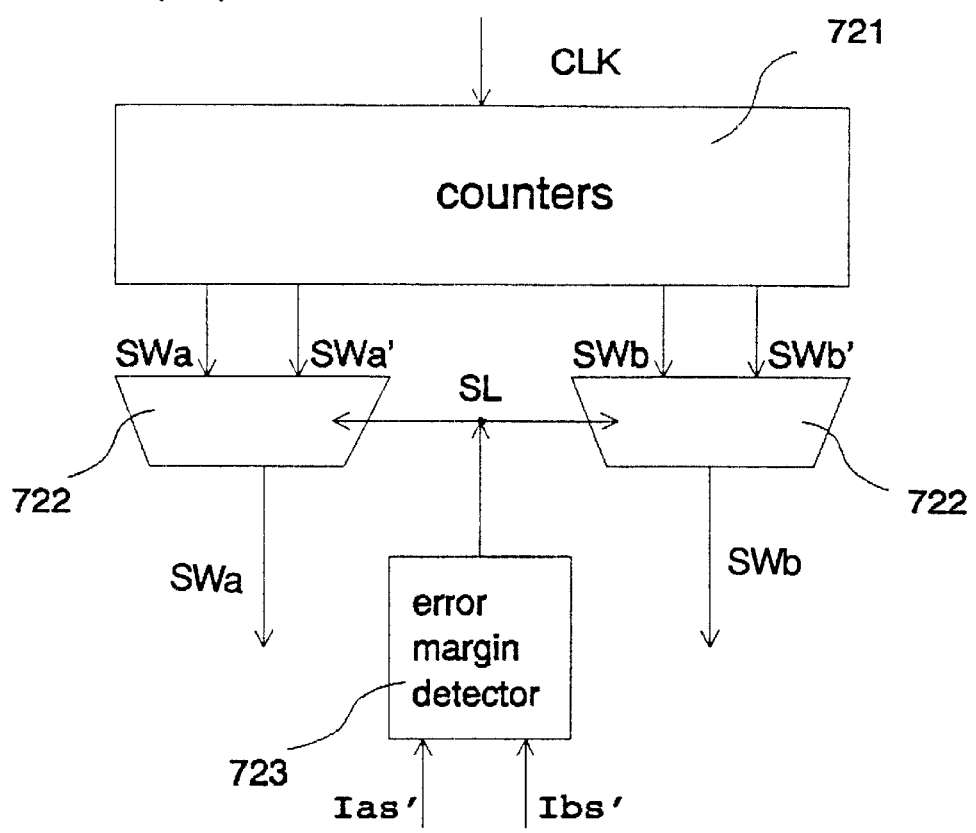
FIG. 7(c) is a block diagram for the reference control signal generator of the system in FIG. 7(a)
Figure 7D:
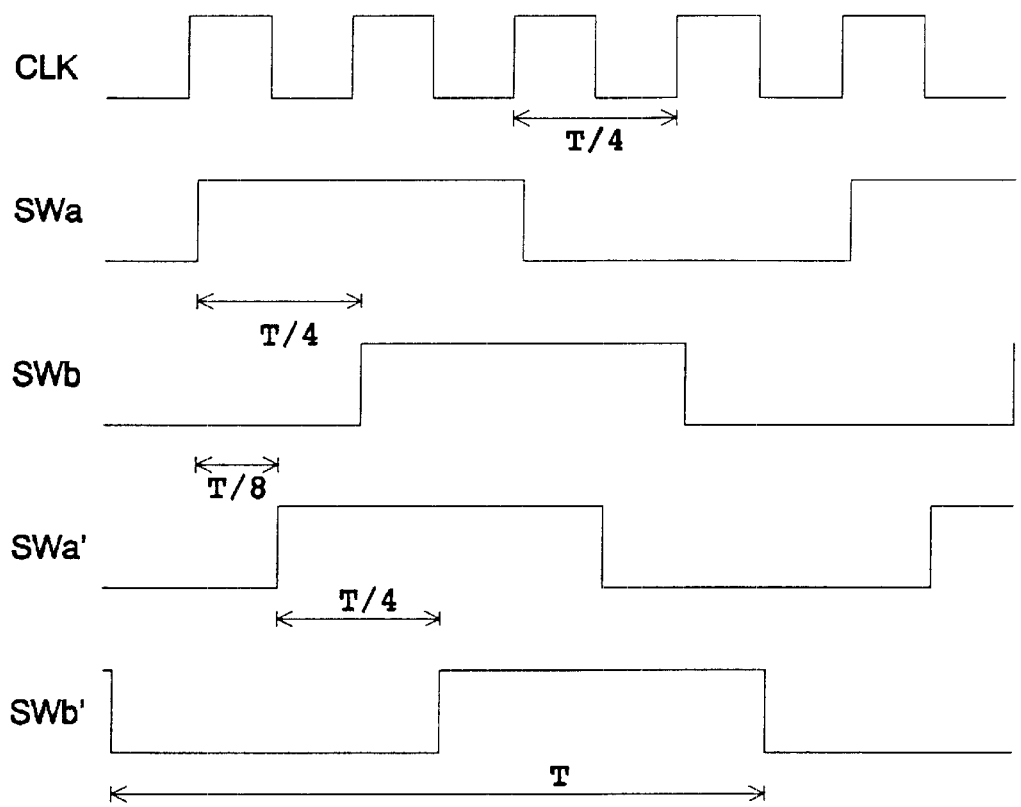
FIG. 7(d) shows the timing relationships of the signals generated by the counters in FIG. 7(c)
Figure 7E:
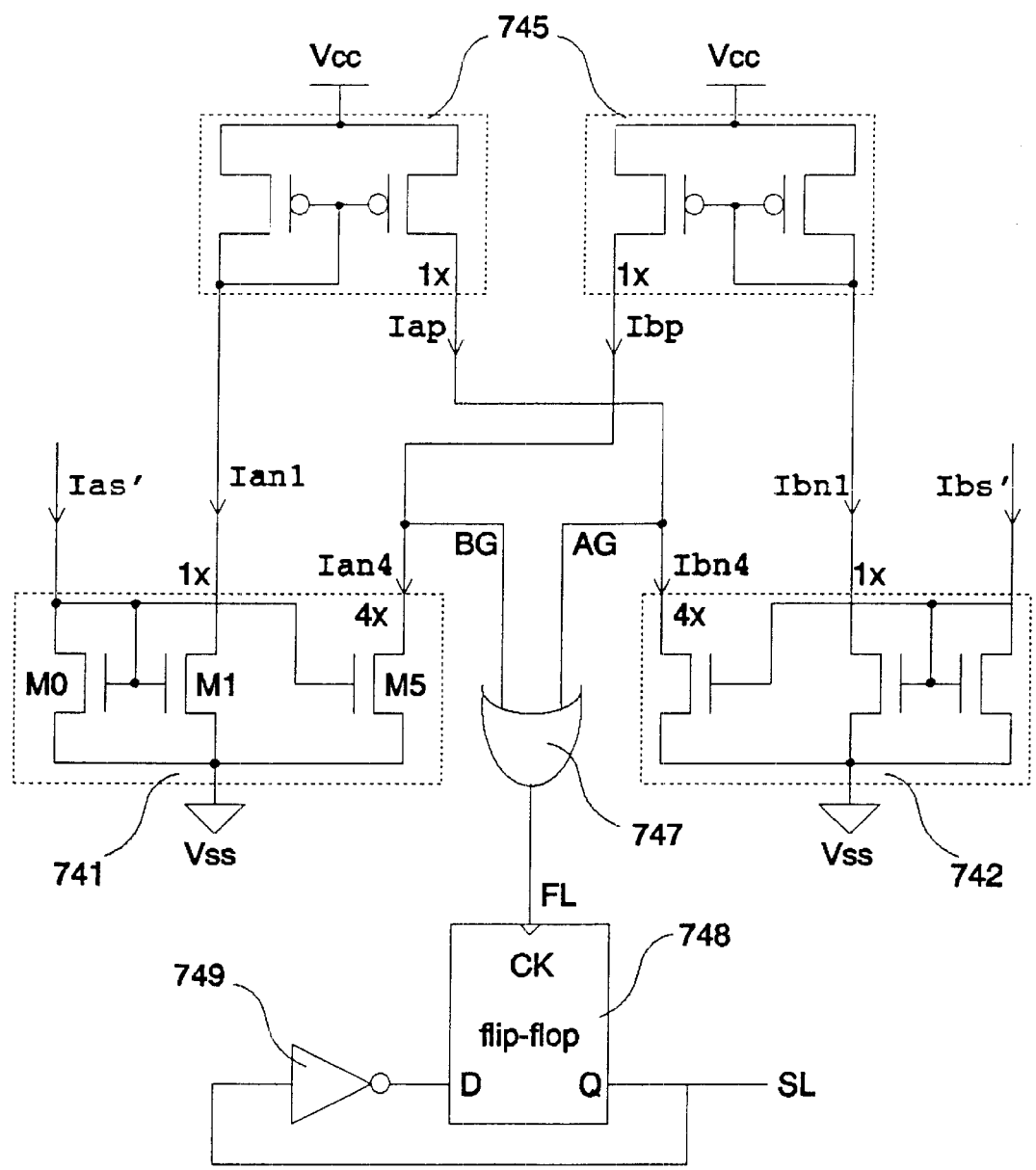
FIG. 7(e) is the schematic diagram for the error margin detector of the control signal generator in FIG. 7(c)
Figure 7F:
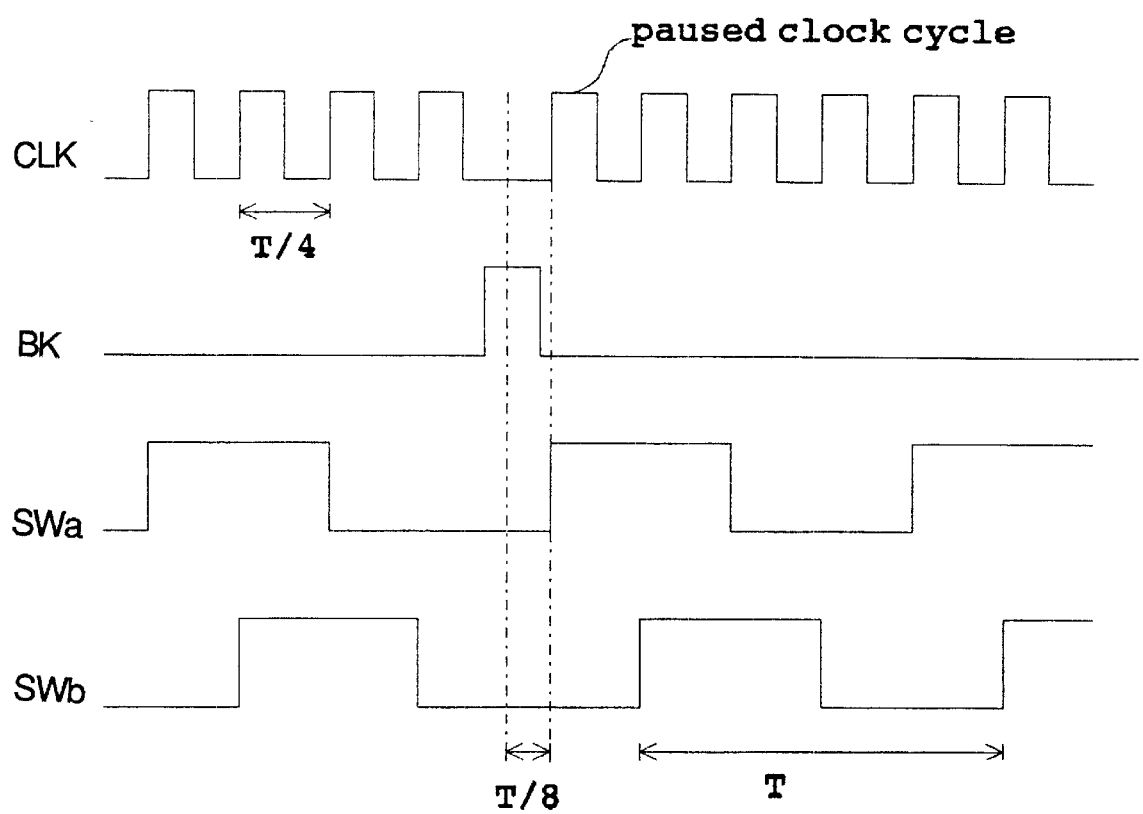
FIG. 7(f) illustrates another method to avoid non-ideal effects for a demodulator of the present invention.

FIG. 7(a) shows the system block diagram of another demodulator of the present invention. This system has the same input stages as the one in FIG. 2(a) so that the mechanism to generate the filtered outputs (Iaf, Iaf#, Ibf, Ibf#) are identical. Its output signal generator 709 is similar to the one in FIG. 2(a) except that it has more p-channel current mirrors (750, 751) as shown in FIG. 7(b). One p-channel current mirror (750) duplicates absolute current Ias to generate an identical current Ias'; the other p-channel current mirror (751) duplicates absolute current Ibs to generate identical currents Ibs' and Ibs". One output from each p-channel current mirror (750, 751) is connected together to generate the summing output current Ioutf. Referring back to FIG. 7(a), output currents Ioutf and Ibs" are sent to a divider (702) to generate an output voltage (Vout) that is proportional to Ibs/Ioutf. FM signals can be extracted from Vout, and AM signals can be extracted from Ioutf. The output current Ias' and Ibs' are sent to a reference signal generator (700) that contains mechanisms to avoid non-ideal effects. FIG. 7(c) is the block diagram of the reference signal generator (700) in FIG. 7(a). The clock signal (CLK) is sent to binary counters (721) to generate four reference control signals (SWa, 5Wa', SWb, SWb'). FIG. 7(d) illustrates the timing relationships between those reference control signals. All of those signals have the same period (T) that is 4 times longer than the CLK period. The rising edge of SWb lags that of SWa by T/4; the rising edge of SWb' lags that of SWa' by T/4; the rising edge of SWa' lags that of SWa by T/8. Referring back to FIG. 7(c), reference control signals SWa, SWa', SWb, SWb' are connected to two multiplexers (722). Those multiplexers select either pair (SWa, SWb) or pair (SWa', SWb') as the reference control signals (SWa, SWb) for current switches (205) in FIG. 7(a) based on a select signal (SL) provided by an error margin detector (723). Details of the error margin detector (723) are shown in FIG. 7(e). Current Ias' is sent to an n-channel current mirror (741) that has two outputs (Ian1, Ian4). The maximum amplitude of Ian4 is four times larger than that of Ias', and the amplitude of Ian1 is the same as that of Ias'. Output current Ibs' is sent to another n-channel current mirror (742) that has two outputs (Ibn1, Ibn4). The maximum amplitude of Ibn4 is four times larger than that of Ibs', and the amplitude of Ibn1 is the same as that of Ibs'. Output currents Ian1 and Ibn1 are sent to p-channel current mirrors (745) to generate currents Iap and Ibp. The maximum magnitude of Iap is the same as that of Ias. The maximum magnitude of Ibp is the same as that of Ibs. The output node for Iap is connected to the output node for Ibn4 at node AG. The voltage at AG will be low unless the magnitude of Ias' is more than four times larger than that of Ibs'. The output node for Ibp is connected to the output node for Ian4 at node BG. The voltage at BG will be low unless the magnitude of Ibs' is more than four times larger than that of Ias'. Nodes AG and BG are connected to an OR gate (747). The output (FL) of the OR gate remains low unless one of the filtered absolute currents (Ias, Ibs) is more than four times larger than the other current. The signal FL is connected to the clock input of a binary counter that contains a flip-flop (748) and an inverter (749). The output of the flip-flop is connected to the select signal SL. When SL stays low, which means current operation condition of the demodulator in FIG. 7(a) is away from quadrant boundaries, SL will not change. When SL goes high, which means that the operation condition of the demodulator in FIG. 7(a) is close to the error sensitive quadrant boundaries, SL will change value to select another set of reference control signals that is 45 degrees out of phase relative to the original reference control signals. The new selection will make the demodulator operate in the safe zone.

Another method to shift the reference control signals by roughly 45 degrees is illustrated in FIG. (7f). When the error margin detector (723) senses that current operation condition is too close to quadrant boundaries, a blocking signal (BK) is sent to pause the input dock (CLK) so that the reference control signals (SWa, SWb) are shifted by roughly 45 degrees as shown in FIG. 7(t). In this way, we do not need to generate 4 reference signals; the 45 degrees shift is provided by pausing the CLK signal.

Figure 7G:
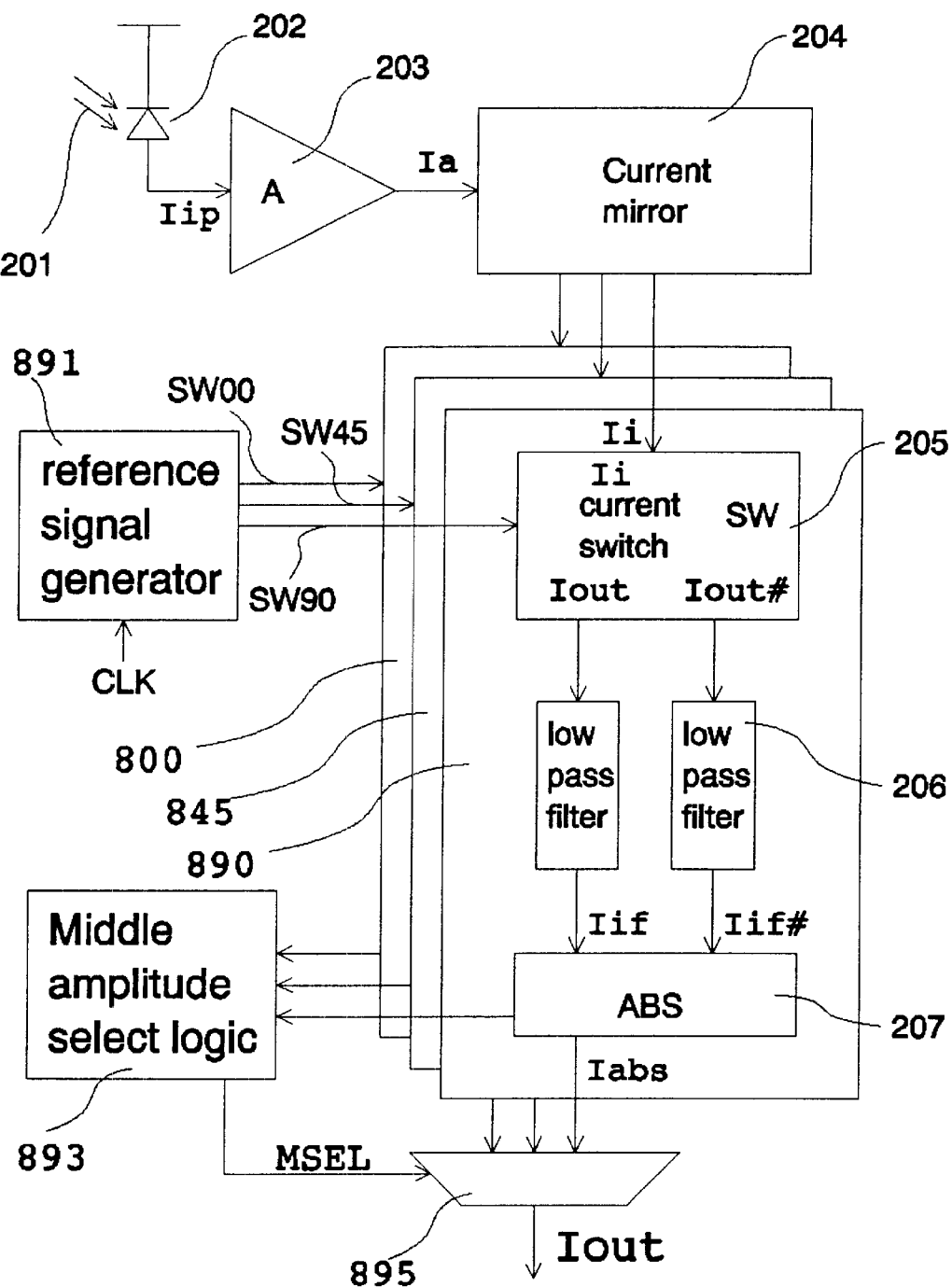
FIG. 7(g) illustrates a method to avoid non-ideal effects for a demodulator of the present invention by comparing the amplitudes of three outputs.

The examples in FIGS. (7a–f) contain feedback mechanisms to adjust the phase difference between internal clock and carrier signals. These feedback mechanisms are different from PLL by the fact that the present invention allows a wide range in phase difference. It is therefore possible to use switching circuits to put the internal control signals within effective operation conditions. There is no need for sophisticated calibration. There is no need to use slow and sensitive feedback mechanism. FIG. 7(g) describes a method to avoid non-ideal effects without using any feedback mechanisms The input stages of the system in FIG. 7(g) are the same as the one in FIG. 2(a). Carrier signal Iip is processed by pre-amplifier (203). The output (Ia) of the pre-amplifier (203) is duplicated by a current mirror (204). Three duplicated currents are sent to three signal processing units (800, 845, 890). Each signal processing unit contains a current switch (205), low pass filters (206) and an absolute current generator (207). The current switch has been described in FIG. 2(b). The absolute current generator (207) has been described in FIG. 2(c). A reference signal generator (891) provides reference control signals (SW00, SW45, SW90) to the current switch (205) in each signal processing unit (800, 845, 890). The phase of SW45 is roughly 45 degrees behind SW00. The phase of SW90 is roughly 90 degrees behind SW00. The phase differences between those reference control signals (SW00, SW45, SW90) do not need to be 45 degrees. Those phase differences can have any arbitrary combination, and they do not need to be accurate. The filtered output of the current switch (Iif) follows similar relationship as those described in Eqs. (2), except that the parameter Db should be replaced with the phase difference of each reference control signals. The absolute current generator (207) sends the absolute value of Iif to a multiplexer (895) and a "Middle Amplitude Select Logic" (MASL). We know that among three outputs, the output with the largest amplitude and the output with the smallest amplitude would be doser to quadrant boundaries than the one with middle amplitude. The MASL (893) determines which one of the three outputs from those three signal processing units (800, 845, 890) has an amplitude in the middle, and sends a select signal (MSEL) to control the multiplexer (895) to select the output with middle amplitude as the final output (Iout). This method does not use any feedback mechanism. The circuitry is therefore very stable.

Figure 8:
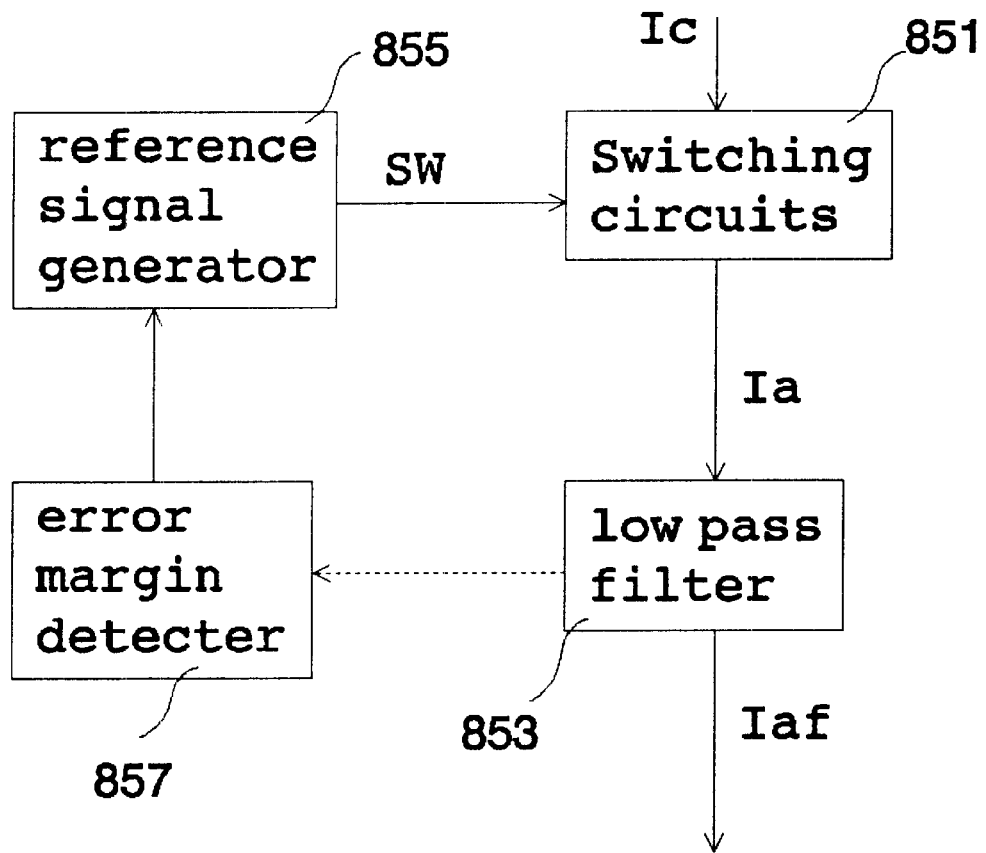
FIG. 8 is a symbolic block diagram illustrating the general structures for demodulators of the present invention.
Figure 9:
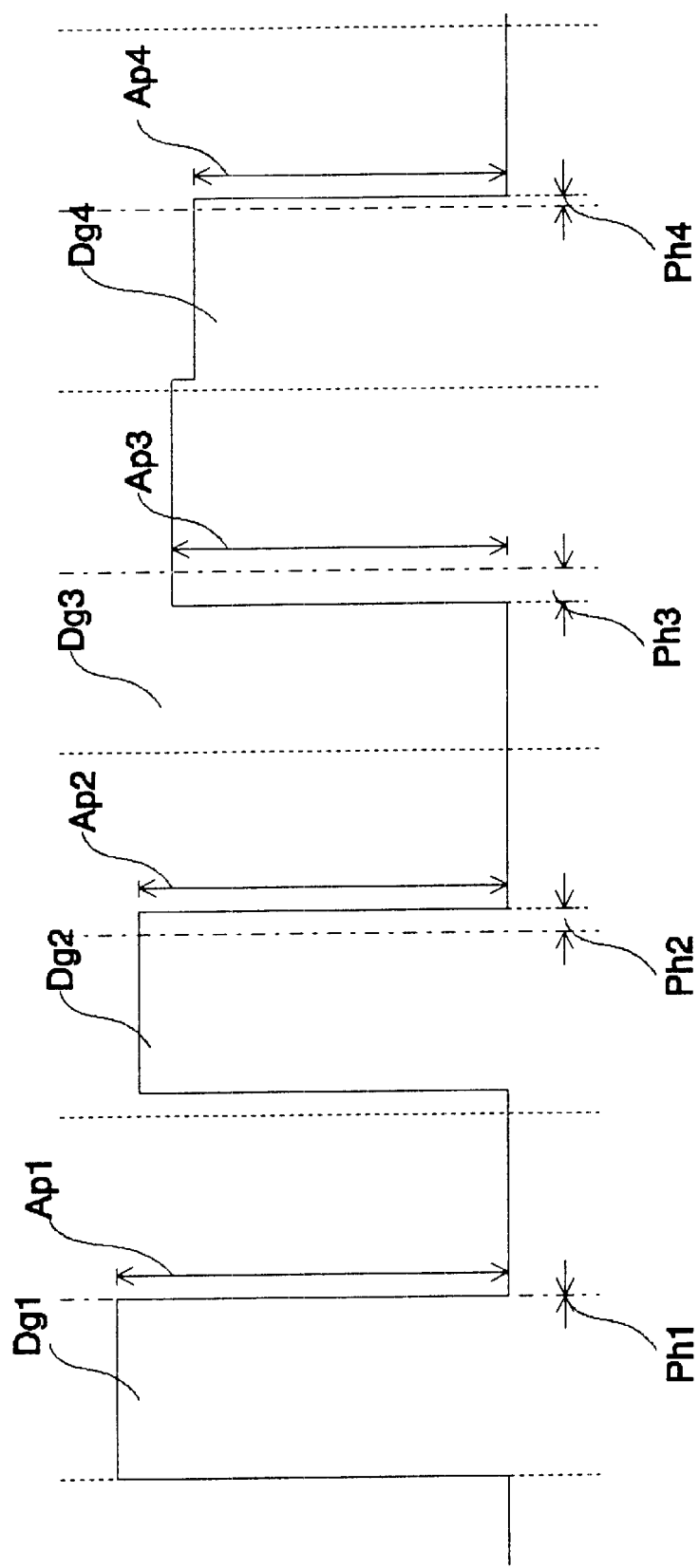
FIG. 9 illustrates a carrier signal of the present invention carrying three types of signals.

FIG. 8 is a general symbolic block diagram for demodulators of the present invention The carrier input signal (Ic) is processed by switching circuits (851) that are controlled by at least one reference control signal (SW). The output of the switching circuit (Ia) changes sign when SW switches. The signal Ia is filtered by a low pass filter to generate output signal Iaf. An error margin detector (857) checks if the reference signal SW is close to quadrant boundaries or not. Outputs of the error margin detector controls the reference signal generator (855) to make sure the operation condition of the demodulator is in the safe zone.

While specific embodiments of the invention have been illustrated and described herein, it is realized that other modifications and changes will occur to those skilled in the art. For example, signal processing circuits disclosed in the above discussions are transferring signals using currents. It will be obvious for those skilled in the art to change part of those circuits using voltage processing circuits. Another obvious modification is to execute part or all of those analyses using digital signal processing methods. The inputs are infrared light signals in our examples while the present invention will be able to support any other types of modulated signals such as radio, television, telephone lines, microwaves, . . . etc. There are many ways to generate the reference control signals. Other than square waves, the reference control signals can be any type of shapes.

These and other modifications and changes are considered within the spirits of the present invention, One major advantage of the demodulation methods described in previous sections is the "quadrant independence" property. We can shift the phases of individual carrier pulses by an integral of 90 degrees without changing the demodulation results. These quadrant independent demodulation methods make it possible to transmit digital signals at the carrier frequency while carrying AM and/or FM signals simultaneously. A carrier signal of the present invention is shown in FIG. 10. Individual pulses of the carrier signal can carry three types of signals: (1)AM signals represented by the amplitudes (Ap1–Ap4) of individual pulses, (2)FM signals represented by small phase shifts (Ph1–Ph4) of individual pulses, and (3)digital signals (Dg1–Dg4) represented by 90 or 180 degrees phase shifts. The quadrant independent demodulation methods described in previous sections already demonstrated their capability to extract FM signal while individual pulses are shifted by an integral of 90 degrees. Now we will describe methods to extract digital data when each individual pulse may have a small phase shift caused by overlapping FM signals.

Figure 10A:
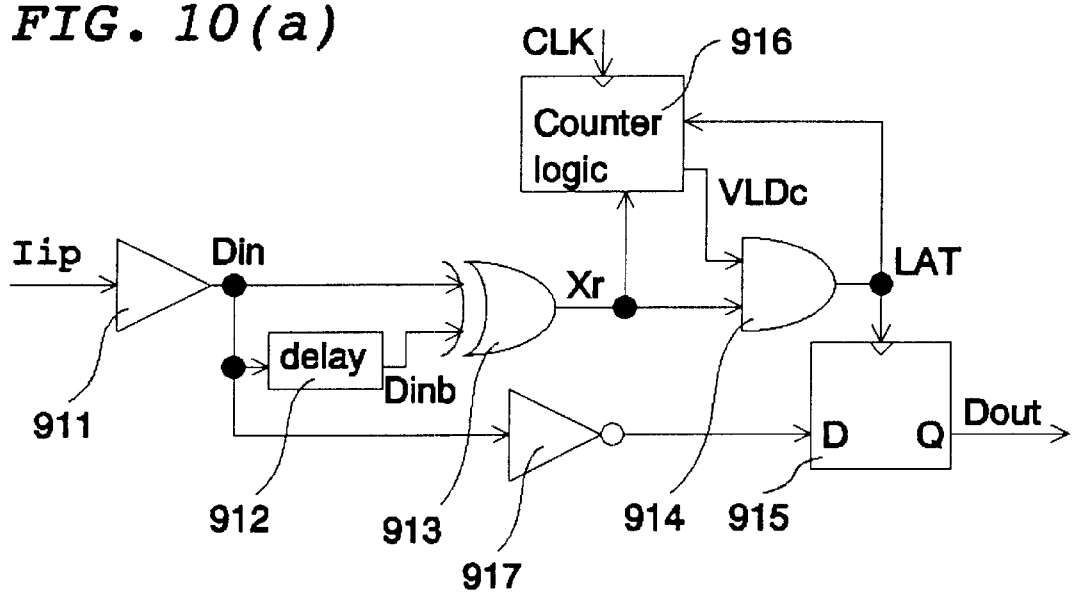
FIG. 10(a) is the block diagram of an example circuitry to decode digital data from a carrier signal of the present invention.
Figure 10B:
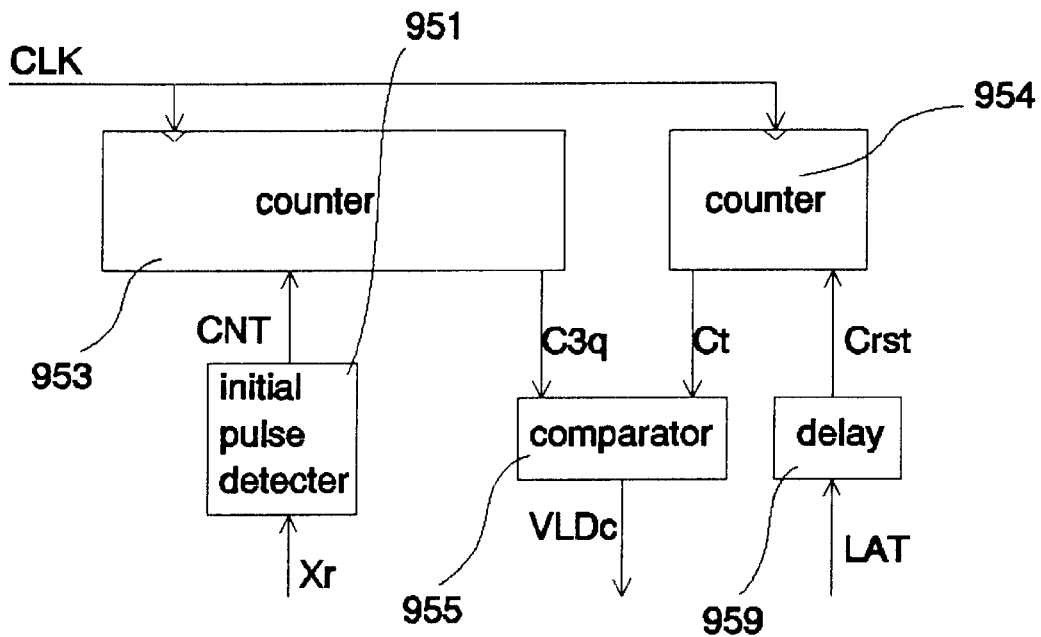
FIG. 10(b) shows further details for the counter logic circuitry in FIG. 10(a)

FIG. 10(a) shows the block diagram of an example circuitry designed to extract digital data from carrier signals of the present invention. The input carrier signal hip is digitized by an input amplifier (911) to generate a digital input signal (Din). A delay circuit (912) generates a delayed signal (Dinb) that is identical to Din but delayed by a few gate delays, roth Din and Dinb are sent to an XOR gate (913) to generate a transaction signal (Xr). Internal clock signal (CLK) is processed by a counter logic (916) to generate a valid signal VLDc. VLDc and Xr are sent to an AND gate (914) to generate a latching signal (LAT). The digital input signal (Din) is inverted by an inverter (917) then sent to the input of a flip-flop (915). The flip-flop latches its input at the falling edges of LAT to generate digital output data (Dout). FIG. 10(b) shows further details of the counter logic in FIG. 10(a). The transaction signal (Xr) is sent to an initial pulse detector (951). The output (CNT) of the initial pulse detector (951) is turned on at the first pulse of Xr after an idle state, and turned off at the second pulse of Xr. Signal CNT turns on a counter (953) to count the number of internal clock (CLK) pulses between the first and the second Xr pulses. The counter (953) holds the final count (C3q) after CNT is turned off. The latching signal (LAT) is sent to a delay circuit (959) that delays LAT by a pre-defined margin. The output signal (Crst) of the delay circuit (959) is sent to another counter (954). After each latching signal (LAT), the counter (954) is reset by Crst, then starts to count the number of internal clock (CLK) pulses as Ct. C3q and Ct are compared by a comparator (955) to generate the valid signal (VLDc). The valid signal (VLDc) is turned off when Ct is smaller than C3q plus a small number (as additional margin). FIG. 10(c) shows the waveforms of critical signals in FIGS. 10(a,b). For the digitized input signal (Din), digital "1" is represented by a pulse with 0 degrees phase shift plus a small FM modulation, while digital "0" is represented by a pulse with 180 degrees phase shift plus a small FM modulation. At idle state, the signal stay at ground voltage. Data transmission pulses always start with a digital "1" as a reference cycle. This type of data format has been used by the well-known ethernet local area network. The difference is that ethernet data transmission started with 5 digital "1" pulses. The transaction signal (Xr) generated by the XOR gate (913) always output a pulse (901, 902) whenever Din has a high-to-low or low-to-high transaction. The signal Xr has two types of pulses as represented by solid lines (902) and dashed lines (901) in FIG. 10(c). The first type of Xr pulse is called "data transaction pulse"; they always happen in the middle of each carrier cycle. Since Din represents a digital "1" by a high-to-low transaction in the middle of a carrier pulse and a digital "0" by a low-to-high transaction, Xr always has a data transaction pulse (902) in the middle of each carrier cycle. If we latch inverted values of Din at the falling edges of those data transaction pulses (902), we will obtain the digital data correctly. When a carrier pulse contains a digital signal that is the same as its previous pulse, Xr also has a pulse (901) at the beginning of a Din cycle (called the "false transaction pulse"), as shown in FIG. 10(c). In order to screen out the false transaction pulses, we use an internal clock signal CLK to generate a valid signal VLDc. After each data transaction pulse, the counter logic (916) in FIG. 10(a) turns off the valid signal (VLDc) for a period of time (Toff) long enough to screen out false transaction pulses but short enough to detect the next data transaction pulse. It is very important to have enough margins in Toff so that overlapping FM signals will not influence the results. This time Toff is defined by the counter logic (916) shown in FIG. 10(b). VLDc and Xr are sent to an AND gate (914) to generate a latching signal (LAT) that contains only the data transaction pulses. The digital data signal (Dout) is therefore extracted using a flip-flop (915) controlled by LAT. The above method works only when we are able to locate the first data transaction pulse. That is why the first pulse of any data transmission must be a digital "1".

The circuits in FIG. (10a) allow us to decode digital data at carrier frequency without using phase-locked loop. With proper definition of Toff, the same carrier signal can carry FM data without influencing detection of digital data. It is therefore possible to carry and detect all three types (AM, FM, digital) of data simultaneously in one carrier signal. All the circuit elements used are ready for manufacture using typical logic IC technologies. No feedback mechanisms are used; the circuits are stable, reliable, and fast. Detection of GHz digital signal can be easily done.

While specific embodiments of the invention have been illustrated and described herein, it is realized that other modifications and changes will occur to those skilled in the art. For example, we can request the first pulse to be digital "0", and the second pulse to be "1", while still define Toff using the same circuitry. There are many other ways to define Toff. For example, one can use charging and discharging of a capacitor to define Toff. If the frequency of the carrier is know, Toff can be pre-defined without using internal timing mechanisms. These and other modifications and changes are considered within the spirits of the present invention.

Comparing with prior art modulation and demodulation methods, the present invention has the following advantages:

(1) All the circuit modules used by the present invention are suitable for implementation using standard IC technologies. It is therefore possible to integrate all elements into a single IC chip to achieve optimum performance.
(2) All the high frequency circuits can be implemented by switching circuits or current mirrors; there is no need to use filters or linear feedback circuits such as PLL. It is therefore possible to support carrier frequency higher than GHZ using existing IC technologies.
(3) Practical methods are provided to avoid distortions caused by non-ideal operation conditions.
(4) Reliability and stability are improved significantly by avoiding noise sensitive circuits.
(5) Maximized data transfer rate by carrying three types of data, (AM, FM, and digital) simultaneously.
(6) Provide flexible data transmission methods that are not detectable using conventional demodulation methods.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:
1. A demodulation method comprising:
   a) receiving a modulated input signal having an input signal frequency;
   b) generating a first switch control signal at a first switching frequency substantially equal to said input signal frequency;
   c) generating a second switch control signal having the same frequency as the first switch control signal and having a phase approximately 90 degrees different from a phase of the first switch control signal; and
   d) controlling at least two switching circuits with said first and second switch control signals for obtaining at least two sets of sampled amplitudes of input signals for generating switching output signals for each of said switching circuits defined by subtracting said sampled amplitudes when said first switch control signal is high by said sampled amplitudes when said first switch control signal is low for each of said switching circuits to generate demodulated output signals for said modulated input signal.

2. The demodulation method of claim 1 further comprising a step of:
   e) summing absolute values of said switching output signals from said switching circuits for determining an amplitude (AM) demodulated signal for said modulated input signal.

3. The demodulation method of claim 2 wherein:
   said step d) of controlling said two switching circuits with said first and second switch control signals for generating said switching output signals further includes steps of d1) controlling a first current mirror with said first switch control signal and controlling a second current mirror with an inverted signal of said first switch control signal for generating said switching output signals; and
   d2) controlling a third current mirror with said second switch control signal and controlling a fourth current mirror with an inverted signal of said second switch control signal for generating said switching output signals.

4. The demodulation method of claim 2 wherein:
   said step e) of summing absolute values of said switching output signals from said switching circuits further includes a step of inputting said switching output signals and inverted signals of said switching output signals from said switching circuits to current mirrors for obtaining absolute signals each representing an absolute value for each of said switching output signals and then inputting said absolute signals to an output current mirror for summing said absolute values of said output signals from said switching circuits.

5. The demodulation method of claim 1 wherein:
   said step b) of generating a first switch control signal at said first switching frequency substantially equal to said input signal frequency, and said step c) of generating a second switch control signal having the same frequency as the first switch control signal and having a phase approximately 90 degrees different from the first switch control signal further includes a step of providing a clock signal having a clock frequency at twice the frequency of said first switching frequency to a switching control signal generator for generating said first and second switch control signals.

6. The demodulation method of claim 1 further comprising steps of:
   e) obtaining a square root of a sum of squares of said switching output signals for generating an amplitude (AM) demodulated signal for said modulated input signal.

7. The demodulation method of claim 1 further comprising steps of:
   e) generating an absolute-value signal for each of said switching output signals; and
   f) providing said absolute-value signal generated from each of said switching output signals to a means for generating said switch control signals to control a phase difference between said switch control signals substantially different from ninety degrees and a multiple of ninety degrees.

8. The demodulation method of claim 1 further comprising a step of:

e) summing absolute values of said switching output signals from said switching circuits for generating a sum of said absolute values for determining an amplitude (AM) demodulated signal for said modulated input signal; and
   f) dividing said switching output signals from said switching circuits by said sum of said absolute values for determining a frequency (FM) demodulated signal for said modulated input signal.

9. The demodulation method of claim 7 further comprises:
   step g) of providing said absolute-value signal generated from each of said switching output signals to a means for generating said switch control signals to control said phase difference between said switch control signals and includes a step g1) of inputting said absolute-value signal for each of said switching output signals to an error margin detector for selecting a set of switch control signals with a phase angle difference substantially different from ninety degrees and a multiple of ninety degrees.

10. The demodulation method of claim 9 wherein:
    said step g1) of inputting said absolute-value signals for each of said switching output signals to an error margin detector for selecting a set of switch control signals further includes a step g2) of providing two sets of said switch control signals and wherein SWa and SWb having a phase difference of ninety degrees, and SWa' and SWb' have a phase difference of ninety degrees, and SWa and SWa' having a phase difference of forty-five degrees;
    g3) inputting said SWa and SWa' to a first multiplexer and inputting said SWb and SWb' to a second multiplexer; and
    g4) applying an output signal from said error margin detector said first multiplexer and said second multiplexer for selecting a set of switch control signals with a phase angle difference substantially different from ninety degrees and a multiple of ninety degrees.

11. The demodulation method of claim 9 wherein:
    said step g1) of inputting said absolute-value signals for each of said switching output signals to an error margin detector for selecting a set of switch control signals further includes the step of g2) comparing one of said switching control signals to a signal of multiple-times of an amplitude of another switch control signal for detecting if said phase difference between said switch control signals is near a phase quadrant boundary with phase angle difference close to a multiple of ninety degrees.

12. The demodulation method of claim 9 wherein:
    said step g1) of providing said absolute-value signal generated from each of said switching output signals to a means for generating said switch control signals to control said phase difference between said switch control signals includes a step g2) of inputting said absolute-value signal for each of said switching output signals to an error margin detector for detecting an error in said phase difference and for sending a phase shifting signal for shifting one of said switch control signals by a phase angle of approximately forty-five degrees.

13. The demodulation method of claim 1 wherein:
    said step d) of generating said demodulated output signals for said modulated input signal further comprising a step d1) of applying a linear relationship between said switching output signals and said phase difference between said switching control signals for determining a frequency (FM) demodulated signal for said modulated input signal; and d2) summing absolute values of said switching output signals from said switching circuits for determining an amplitude (AM) demodulated signal for said modulated input signal.

14. A demodulation apparatus for demodulating a modulated input signal transmitted at a carrier frequency comprising:

a current mirror for receiving said modulated input signal and generating a first and a second current-mirror output signals of same amplitude and frequency as said modulated input signal;

a first and a second switch-controlled sampling circuits connected to said current mirror for receiving said first and second current mirror output signals respectively;

a switching signal generator provided for generating a first and a second switch control signals having a frequency substantially equal to said carrier frequency with an adjustable phase difference between said first and said second switch control signals; and said switching signal generator is connected to said first and second switch-controlled sampling circuits for providing a first and a second switch control signals, adjusted to have a phase difference near ninety degrees, to said first and second switch-controlled sampling circuits respectively for demodulating said modulated input signal.

15. The demodulation apparatus of claim 14 further comprising:

a first and a second absolute-value circuits connected to said first and second switch-controlled sampling circuits respectively for obtaining an absolute value of a first and a second switch-controlled sampling outputs respectively; and a summing circuit connected to said first and second absolute-value circuits for summing said absolute-values of said first and second switch-controlled sampling outputs for carrying out an amplitude (AM) demodulation of said input modulated signal.

16. The demodulation apparatus of claim 14 wherein:

each of said first and second switch-controlled sampling circuits further includes a first current mirror and a second current mirror controlled by said switch control signals for generating switch-controlled sampling outputs.

* * * * *